(12) United States Patent
de Mos et al.

(10) Patent No.: US 6,490,307 B1
(45) Date of Patent: Dec. 3, 2002

(54) METHOD AND PROCEDURE TO AUTOMATICALLY STABILIZE EXCIMER LASER OUTPUT PARAMETERS

(75) Inventors: Bruno Becker de Mos, Biebesheim (DE); Uwe Stamm, Göttingen (DE); Klaus Vogler, Göttingen (DE)

(73) Assignee: Lambda Physik AG, Goettingen (DE)

( * ) Notice: Subject to any disclaimer, the term of this patent is extended or adjusted under 35 U.S.C. 154(b) by 0 days.

(21) Appl. No.: 09/447,882

(22) Filed: Nov. 23, 1999

Related U.S. Application Data
(60) Provisional application No. 60/124,785, filed on Mar. 17, 1999.

(51) Int. Cl.[7] .............................. H01S 3/22; H01S 3/223
(52) U.S. Cl. .............................. 372/59; 372/55; 372/57; 372/60
(58) Field of Search .............................. 372/55, 57, 59, 372/60

(56) References Cited

U.S. PATENT DOCUMENTS

| | | | |
|---|---|---|---|
| 3,899,750 A | 8/1975 | Houchuli | 331/94.5 G |
| 4,009,933 A | 3/1977 | Firester | 350/152 |
| 4,240,044 A | 12/1980 | Fahlen et al. | 331/94.5 PE |
| 4,380,079 A | 4/1983 | Cohn et al. | 372/87 |
| 4,393,505 A | 7/1983 | Fahlen | 372/57 |
| 4,399,540 A | 8/1983 | Buecher | 372/20 |
| 4,429,392 A | 1/1984 | Yoshida et al. | 372/9 |
| 4,534,034 A | 8/1985 | Hohla et al. | 372/59 |
| 4,611,270 A | 9/1986 | Klauminzer et al. | 364/183 |
| 4,616,908 A | 10/1986 | King | 350/576 |
| 4,674,099 A | 6/1987 | Turner | 372/59 |
| 4,686,682 A | 8/1987 | Haruta et al. | 372/87 |

(List continued on next page.)

FOREIGN PATENT DOCUMENTS

| | | | |
|---|---|---|---|
| EP | 0 459 503 A3 | 12/1991 | H01S/3/08 |
| EP | 0 459 503 A2 | 12/1991 | H01S/3/08 |
| EP | 0 532 751 A1 | 3/1993 | H01S/3/038 |
| EP | 0 532 751 B1 | 3/1993 | H01S/3/038 |
| EP | 1 091 462 A2 | 4/2000 | H01S/3/225 |

(List continued on next page.)

OTHER PUBLICATIONS

T.Y. Chang, "Improved Uniform-Filed Electrode Profiles for TEA Laser and High-Voltage Applications," *The Review of Scientific Instruments*, Apr. 1973, vol. 44, No. 4, pp. 405-407.

Tennant et al., "Excimer Laser Chemical Problems," *Los Almos National Laboratory Report*, 1982., pp. 1-81.

(List continued on next page.)

*Primary Examiner*—Paul Ip
*Assistant Examiner*—Cornelius H Jackson
(74) *Attorney, Agent, or Firm*—Sierra Patent Group, Ltd.; Andrew V. Smith

(57) ABSTRACT

A method and apparatus is provided for stabilizing output beam parameters of a gas discharge laser by maintaining a constituent gas of the laser gas mixture at a predetermined partial pressure using a gas supply unit and a processor. The constituent gas of the laser gas mixture is provided at an initial partial pressure and the constituent gas is subject to depletion within the laser discharge chamber. A parameter such as time, pulse count, driving voltage for maintaining a constant laser beam output energy, pulse shape, pulse duration, pulse stability, beam profile, bandwidth of the laser beam, temporal or spatial coherence, discharge width, or a combination thereof, which varies with a known correspondence to the partial pressure of the constituent gas is monitored. Injections of the constituent gas are performed each to increase the partial pressure by a selected amount in the discharge chamber. A number of successive injections is performed at selected intervals to maintain the constituent gas substantially at the initial partial pressure for maintaining stable output beam parameters.

92 Claims, 15 Drawing Sheets

U.S. PATENT DOCUMENTS

| | | | |
|---|---|---|---|
| 4,691,322 A | 9/1987 | Nozue et al. | 372/82 |
| 4,716,569 A | 12/1987 | Bees | 372/38 |
| 4,719,637 A | 1/1988 | Cavaioli et al. | 372/59 |
| 4,722,090 A | 1/1988 | Haruta et al. | 372/57 |
| 4,740,982 A | 4/1988 | Hakuta et al. | 372/59 |
| 4,763,336 A | 8/1988 | Stephens | 372/81 |
| 4,829,536 A | 5/1989 | Kajiyama et al. | 372/57 |
| 4,856,018 A | 8/1989 | Nozue et al. | 372/98 |
| 4,860,300 A | 8/1989 | Baeumler et al. | 372/57 |
| 4,891,818 A | 1/1990 | Levatter | 372/57 |
| 4,905,243 A | 2/1990 | Lokai et al. | 372/32 |
| 4,926,428 A | 5/1990 | Kajiyama et al. | 372/20 |
| 4,953,174 A | 8/1990 | Eldridge et al. | 372/87 |
| 4,975,919 A | 12/1990 | Amada et al. | 372/33 |
| 4,977,573 A | 12/1990 | Bittenson et al. | 372/81 |
| 5,001,721 A | 3/1991 | Ludewig et al. | 372/59 |
| 5,005,181 A | 4/1991 | Yoshioka et al. | 372/59 |
| 5,025,445 A | 6/1991 | Anderson et al. | 372/20 |
| 5,081,635 A | 1/1992 | Wakabayashi et al. | 372/57 |
| 5,090,020 A | 2/1992 | Bedwell | 372/59 |
| 5,095,492 A | 3/1992 | Sandstorm | 372/102 |
| 5,097,291 A | 3/1992 | Suzuki | 355/69 |
| 5,099,491 A | 3/1992 | Chaffee | 372/59 |
| 5,111,473 A | 5/1992 | Rebhan et al. | 372/59 |
| 5,136,605 A | 8/1992 | Basting et al. | 372/59 |
| 5,140,600 A | 8/1992 | Rebhan | 372/25 |
| 5,142,543 A | 8/1992 | Wakabayashi et al. | 372/32 |
| 5,149,659 A | 9/1992 | Hakuta et al. | 436/55 |
| 5,150,370 A | 9/1992 | Furuya et al. | 372/106 |
| 5,221,823 A | 6/1993 | Usui | 219/121.78 |
| 5,226,050 A | 7/1993 | Burghardt | 372/20 |
| 5,243,614 A | 9/1993 | Wakata et al. | 372/29 |
| 5,247,531 A | 9/1993 | Mueller-Horsche | 372/38 |
| 5,247,534 A | 9/1993 | Mueller-Horsche | 372/58 |
| 5,247,535 A | 9/1993 | Mueller-Horsche et al. | 372/86 |
| 5,260,961 A | 11/1993 | Zhou et al. | 372/57 |
| 5,307,364 A | 4/1994 | Turner | 372/60 |
| 5,337,330 A | 8/1994 | Larson | 372/86 |
| 5,377,215 A | 12/1994 | Das et al. | 372/57 |
| 5,396,514 A | 3/1995 | Voss | 372/57 |
| 5,404,366 A | 4/1995 | Wakabayashi et al. | 372/29 |
| 5,405,207 A | 4/1995 | Zubli | 401/110 |
| 5,430,752 A | 7/1995 | Basting et al. | 372/59 |
| 5,440,578 A | 8/1995 | Sandstrom | 372/59 |
| 5,450,436 A | 9/1995 | Mizoguchi et al. | 372/59 |
| 5,463,650 A | 10/1995 | Ito et al. | 372/57 |
| 5,534,034 A | 7/1996 | Caspers | 623/32 |
| 5,535,233 A | 7/1996 | Mozoguchi et al. | 372/87 |
| 5,557,629 A | 9/1996 | Mozoguchi et al. | 372/87 |
| 5,559,584 A | 9/1996 | Miyaji et al. | 355/73 |
| 5,559,816 A | 9/1996 | Basting et al. | 372/27 |
| 5,586,134 A | 12/1996 | Das et al. | 372/38 |
| 5,596,596 A | 1/1997 | Wakabayashi et al. | 372/102 |
| 5,598,300 A | 1/1997 | Magnusson et al. | 359/566 |
| 5,642,374 A | 6/1997 | Wakabayashi et al. | 372/57 |
| 5,646,954 A | 7/1997 | Das et al. | 372/55 |
| 5,652,681 A | 7/1997 | Chen et al. | 359/831 |
| 5,659,419 A | 8/1997 | Lokai et al. | 359/330 |
| 5,659,531 A | 8/1997 | Ono et al. | 369/109 |
| 5,663,973 A | 9/1997 | Stamm et al. | 372/20 |
| 5,684,822 A | 11/1997 | Partlo | 372/95 |
| 5,710,787 A | 1/1998 | Amada et al. | 372/25 |
| 5,729,562 A | 3/1998 | Birx et al. | 372/38 |
| 5,729,565 A | 3/1998 | Meller et al. | 372/87 |
| 5,748,346 A | 5/1998 | David et al. | 359/15 |
| 5,754,579 A | 5/1998 | Mizoguchi et al. | 372/58 |
| 5,761,236 A | 6/1998 | Kleinschmidt et al. | 372/100 |
| 5,763,855 A | 6/1998 | Shioji | 219/121.84 |
| 5,771,258 A | 6/1998 | Morton et al. | 372/57 |
| 5,802,094 A | 9/1998 | Wakabayashi et al. | 372/57 |
| 5,811,753 A | 9/1998 | Weick et al. | 219/121.78 |
| 5,818,865 A | 10/1998 | Watson et al. | 372/86 |
| 5,835,520 A | 11/1998 | Das et al. | 372/57 |
| 5,852,627 A | 12/1998 | Ershov | 372/108 |
| 5,856,991 A | 1/1999 | Ershov | 372/57 |
| 5,887,014 A | 3/1999 | Das | 372/59 |
| 5,898,725 A | 4/1999 | Fomenkov et al. | 372/102 |
| 5,901,163 A | 5/1999 | Ershov | 372/20 |
| 5,914,974 A | 6/1999 | Partlo et al. | 372/38 |
| 5,917,849 A | 6/1999 | Ershov | 372/102 |
| 5,923,693 A | 7/1999 | Ohmi et al. | 372/57 |
| 5,936,988 A | 8/1999 | Partlo et al. | 372/38 |
| 5,940,421 A | 8/1999 | Partlo et al. | 372/38 |
| 5,946,337 A | 8/1999 | Govorkov et al. | 372/92 |
| 5,949,806 A | 9/1999 | Ness et al. | 372/38 |
| 5,970,082 A | 10/1999 | Ershov | 372/102 |
| 5,978,391 A | 11/1999 | Das et al. | 372/20 |
| 5,978,394 A | 11/1999 | Newman et al. | 372/32 |
| 5,978,405 A | 11/1999 | Juhasz et al. | 372/57 |
| 5,978,406 A | 11/1999 | Rokni et al. | 372/58 |
| 5,978,409 A | 11/1999 | Das et al. | 372/100 |
| 5,982,795 A | 11/1999 | Rothweil et al. | 372/38 |
| 5,982,800 A | 11/1999 | Ishihara et al. | 372/57 |
| 5,991,324 A | 11/1999 | Knowles et al. | 372/57 |
| 5,999,318 A | 12/1999 | Morton et al. | 359/572 |
| 6,005,879 A | 12/1999 | Sandstrom et al. | 372/25 |
| 6,005,880 A | 12/1999 | Basting et al. | 372/38 |
| 6,014,398 A | 1/2000 | Hofmann et al. | 372/60 |
| 6,018,537 A | 1/2000 | Hofmann et al. | 372/25 |
| 6,020,723 A | 2/2000 | Desor et al. | 320/166 |
| 6,028,872 A | 2/2000 | Partlo et al. | 372/38 |
| 6,028,880 A | 2/2000 | Carlesi et al. | 372/58 |
| 6,061,382 A | 5/2000 | Govorkov et al. | 372/101 |
| 6,081,542 A | 6/2000 | Scaggs | 372/70 |
| 6,084,897 A | 7/2000 | Wakabayashi et al. | 372/38 |
| 6,130,904 A | 10/2000 | Ishihara et al. | 372/59 |
| 6,151,346 A | 11/2000 | Partlo et al. | 372/38 |
| 6,151,350 A | 11/2000 | Komori et al. | 372/59 |
| 6,154,470 A | 11/2000 | Basting et al. | 372/19 |
| 6,157,662 A | 12/2000 | Scaggs et al. | 372/60 |
| 6,160,831 A | 12/2000 | Kleinschmidt et al. | 372/57 |
| 6,160,832 A | 12/2000 | Kleinschmidt et al. | 372/57 |
| 6,188,710 B1 | 2/2001 | Besaucele et al. | 372/60 |

FOREIGN PATENT DOCUMENTS

| | | | | |
|---|---|---|---|---|
| EP | 1 075 060 A2 | 2/2001 | | H01S/3/225 |
| EP | 1 091 462 A2 | 4/2001 | | H01S/3/225 |
| JP | 63-86593 A | 4/1988 | | H01S/3/134 |
| JP | Hei 1-115182 | 5/1989 | | H01S/3/134 |
| JP | Hei 3-166784 | 7/1991 | | H01S/3/134 |
| JP | Hei 3-2658180 | 11/1991 | | H01S/3/097 |
| JP | Hei 4-17380 | 1/1992 | | H01S/3/097 |
| JP | 10341050 | 12/1998 | | H01S/3/036 |
| WO | WO 99/19952 | 4/1999 | | H01S/3/22 |

OTHER PUBLICATIONS

E.A. Stappaerts, "A Novel Analytical Design Method for Discharge Laser Electrode Profiles," *Applied Physics Letters*, Jun. 15, 1982, vol. 40, No. 12, pp. 1018–1019.

G.J. Ernst, "Compact Uniform Field Electrode Profiles," *Optics Communications*, Aug. 1, 1983, vol. 47, No. 1, pp. 47–51.

G.J. Ernst, "Uniform–Field Electrodes with Minimum Width," *Optics Communications*, vol. 49., No. 4., Mar. 15, 1984, pp. 275–277.

Marchetti et al., "A New Type of Corona–Discharge Photoionization Source for Gas Lasers," *Journal of Applied Physics*, Dec. 1, 1984; vol. 56., No. 11., pp. 3163–3168.

Taylor, R.S., "Preionization and Discharge Stability Study of Long Optical Pulse Duration UV–Preionized XeCl Lasers", *Applied Physics B*, 1986, vol. 41., pp. 1–24.

Ogura, S. et al., "Output Power Stabilization of a XeCl Excimer Laser," *Proceedings of SPIE: Gas and Metal Vapor Lasers and Applications*, Jan. 20–22,1991., vol. 1412., pp. 123–128.

Golobic et al., Clinical Experience with an Excimer Laser Angioplasty System, *Proceedings of Diagnostic and Therapeutic Cardiovascular Interventions SPIE*, Jan. 20–22, 1991, vol. 1425., pp. 84–91.

Ujda, Z. et al., "Analysis of Possibility of Computer Control of the Parameters of an Excimer Laser Part II Results of Computerization of the Parameter of a XeCl Laser," *Journal of Technical Physics*, 1191, pp. 399–408.

Elliott et al., "Recent Advances in an Excimer Laser Source for Microlithography," *J.Vac. Sci. Technol.*, Nov./Dec. 1991., vol. 9., No. 6., pp. 3122–3125.

Basting et al., "Industrial Excimer Lasers Fundamentals," Technology and Maintenance, 1991, pp. 1–97.

Turner et al., "Dependence of Excimer Laser Beam Properties on Laser Gas Composition," *SPIE*, 1993, vol. 1835., pp. 158–164.

Taylor et al., "Pre–preionization of a Long Optical Pulse Magnetic–Spiker Sustainer XeCl Laser," *Review of Scientific Instruments*, 1994, vol. 65., No. 12., pp. 3621–3627.

Borisov et al., "Effects Limiting the Average Power of Compact Pulse–Periodic KrF Lasers," *Quantum Mechanics*, vol. 25., No. 5., pp. 421–425, 1995.

R.S. Taylor., "Transmission Properties of Spark Preionization Radiation in Rare–Gas Halide Laser Gas Mixes," *IEEE Journal of Quantum Mechanics of Quantum Mechanics*, Dec. 1995, vol. 31., No. 12., pp. 2195–2207.

Wakabayashi et al., "Billion Level Durable ArF Excimer Laser with Highly Stable Energy," *SPIE $24^{th}$ Annual International Symposium on Microlithography*, May 14–19, 1999.

Enami et al., "High Spectral Purity and High Durability kHz KrF Excimer Laser with Advanced RF Pre–ionization Discharge," *Proceedings of SPIE Optical Microlithography XI*, Feb. 1998, vol. 3334, pp. 1031–1040.

Kataota, et al., "Performance Improvement of a Discharge–Pumped ArF Excimer Laser by Xenon Gas Addition," *Jpn. J. Appl. Phys.*, vol. 38, 1999, pp. 6735–6738.

Patent Abstracts of Japan, vol. 016, No. 312, Jul. 9, 1992 & JP 04 087388 A.

R.S. Taylor, "Preionization and Discharge Stability Study of Long Optical Pulse Duration UV–Preionized XeCl Lasers," *Applied Physics B*, vol. B 41, No. 1, Sep. 1986.

G.M. Jursich, et al., "Gas contaminant effects in discharge–excited KrF lasers," *Applied Optics*, vol. 31, Apr. 1992.

Joseph H. Eberly, "Superradiance Revisited," *American Journal of Physics*, vol. 40/10, Oct. 1972.

R. Pätzel, et al., "KrF Excimer Laser with repetition rates of 1 kHz for DUV Lithography," *SPIE*, vol. 2440, 101, 1995.

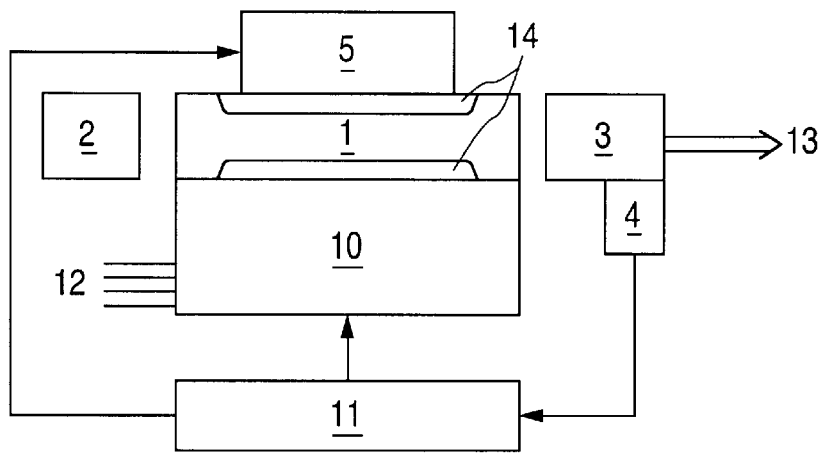

1 Laser tube containing the laser gas mixture, electrodes, fan and cooling unit
2 rear optics module including wavelength calibration module and rear resonator reflector
3 front optics module including line/selection or line narrowing module and output coupling resonator reflector
4 energy detector
5 electrical pulse power and discharge module
10 gas control box including vacuum pump and valve module
11 computer control unit containing parameter setting and expert system including databases
12 gas lines to gas containers or the gas distribution system of the fab
13 laser output beam

FIG. 13a

Shows the scheme of the gas distribution and accumulation unit:

36a-36d  gas connection lines to the different gas types
8a-8d   gas valves
34   valve to laser tube
35   tube fill line
32   valve for evacuation to pump and fluorine (halogen) filter (HF)
7    gas compartment and/or inlet reservoir Valves for gas control system including micro-halogen injections H: halogen gas
R: rare gas
B: buffer gas
I: inert gas
LH: laser head
V: vacuum

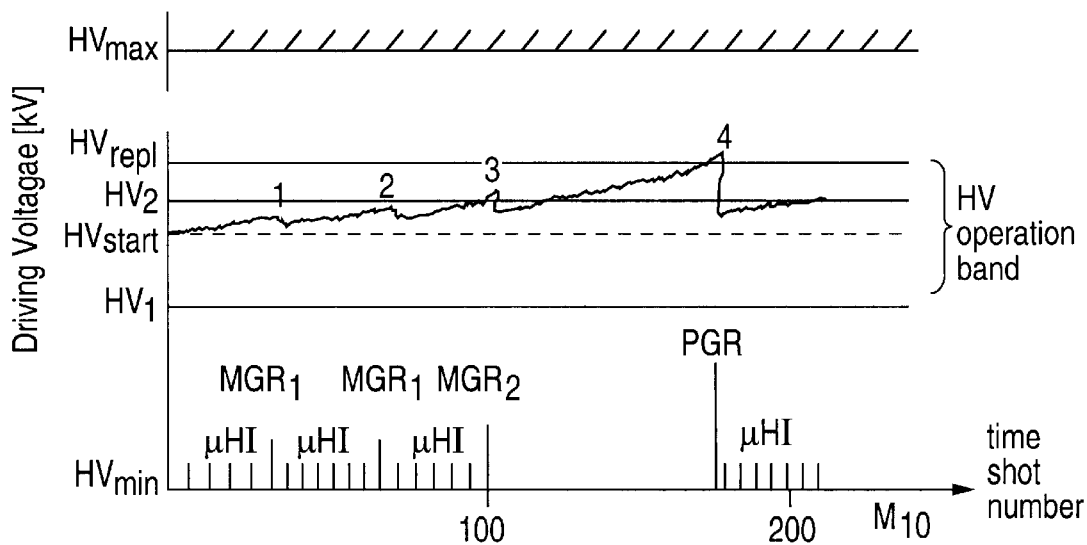

Basic scheme of the time- and high-voltage-controlled micro-gas-regulation procedure $HV_1/HV_2$ - marking normal HV - operation band $HV_{max}$ - maximum operation voltage of the power supply $HV_{min}$ - minimum operation voltage of the power supply $HV_{start}$ - operation voltage for optical laser gas composition realized e.g. after a new fill $HV_{repl}$ - voltage initiating a separately predetermined amount of partial gas replacement PGR $\mu HI$ - time and shot counter related Micro Halogen ($\mu HI$) Injections (diluted halogen or halogen rare premix = Premix A)

1,2,3 - time and shot counter related Miini-Gas Replacements (MGR) i.e. Miini injections of halogen, rare and buffer or halogen- and rare-premixes (premix A and B) combined with small pumping out for pressure adjustment 4 - larger volume gas replacement (PGR) driven by crossing a certain high voltage level (i.e. a magnified MGR n-times Premix A, m - times Premix B)

FIG. 21 t,n - time, shot counter
μHI - Micro-Halogen-Injection
MGR - Mini-Gas-Replacement
PGR - Partial-Gas-Replacement
$HV_1$, HV - values according to the scheme given in Fig. 8

METHOD AND PROCEDURE TO AUTOMATICALLY STABILIZE EXCIMER LASER OUTPUT PARAMETERS

PRIORITY

This application claims the benefit of priority to U.S. provisional patent application No. 60/124,785, filed Mar. 17, 1999.

BACKGROUND OF THE INVENTION

1. Field of the Invention

The present invention relates to a method and apparatus for stabilizing output beam parameters of a gas discharge laser. More particularly, the present invention relates to maintaining an optimal gas mixture composition over long, continuous operating or static periods using very small gas injections.

2. Discussion of the Related Art

Pulsed gas discharge lasers such as excimer and molecular lasers emitting in the deep ultraviolet (DUV) or vacuum ultraviolet (VUV) have become very important for industrial applications such as photolithography. Such lasers generally include a discharge chamber containing two or more gases such as a halogen and one or two rare gases. KrF (248 nm), ArF (193 nm), XeF (350 nm), KrCl (222 nm), XeCl (308 nm), and $F_2$ (157 nm) lasers are examples.

The efficiencies of excitation of the gas mixtures and various parameters of the output beams of these lasers vary sensitively with the compositions of their gas mixtures. An optimal gas mixture composition for a KrF laser has preferred gas mixture component ratios around 0.1% $F_2$ /1% Kr/98,9% Ne (see U.S. Pat. No. 4,393,505, which is assigned to the same assignee as the present application and is hereby incorporated by reference into the present application). A $F_2$ laser may have a gas component ratio around 0.1% $F_2$/99.9% Ne (see U.S. patent application Ser. No. 09/317,526, which is assigned to the same assignee as the present application and is hereby incorporated by reference into the present application). Small amounts of Xe may be added to rare gas halide gas mixtures, as well (see R. S. Taylor and K. E. Leopold, *Transmission Properties of Spark Preionization Radiation in Rare-Gas Hailde Laser Gas Mixes*, IEEE Journal of Quantum Electronics, pp. 2195–2207, vol. 31, no. 12 (December. 1995). Any deviation from the optimum gas compositions of these or other excimer or molecular lasers would typically result in instabilities or reductions from optimal of one or more output beam parameters such as beam energy, energy stability, temporal pulse width, temporal coherence, spatial coherence, discharge width, bandwidth, and long and short axial beam profiles and divergences.

Especially important in this regard is the concentration (or partial pressure) of the halogen, e.g., $F_2$, in the gas mixture. The depletion of the rare gases, e.g., Kr and Ne for a KrF laser, is low in comparison to that for the $F_2$. FIG. 1 shows laser output efficiency versus $F_2$ concentration for a KrF laser, showing a decreasing output efficiency away from a central maximum. FIG. 2 shows how the temporal pulse width (pulse length or duration) of KrF laser pulses decrease with increasing $F_2$ concentration. FIGS. 3–4 show the dependence of output energy on driving voltage (i.e., of the discharge circuit) for various $F_2$ concentrations of a $F_2$ laser. It is observed from FIGS. 3–4 that for any given driving voltage, the pulse energy decreases with decreasing $F_2$ concentration. In FIG. 3, for example, at 1.9 kV, the pulse energies are around 13 mJ, 11 mJ and 10 mJ for $F_2$ partial pressures of 3.46 mbar, 3.16 mbar and 2.86 mbar, respectively. The legend in FIG. 3 indicates the partial pressures of two premixes, i.e., premix A and premix B, that are filled into the discharge chamber of a KrF laser. Premix A comprised substantially 1% $F_2$ and 99% Ne, and premix B comprised substantially 1% Kr and 99% Ne. Therefore, for the graph indicated by triangular data points, a partial pressure of 346 mbar for premix A indicates that the gas mixture had substantially 3.46 mbar of $F_2$ and a partial pressure of 3200 mbar for premix B indicates that the gas mixture had substantially 32 mbar of Kr, the remainder of the gas mixture being the buffer gas Ne. FIG. 5 shows a steadily increasing bandwidth of a KrF laser with increasing $F_2$ concentration.

In industrial applications, it is advantageous to have an excimer or molecular fluorine laser capable of operating continuously for long periods of time, i.e., having minimal downtime. It is desired to have an excimer or molecular laser capable of running non-stop year round, or at least having a minimal number and duration of down time periods for scheduled maintenance, while maintaining constant output beam parameters. Uptimes of, e.g., greater than 98% require precise control and stabilization of output beam parameters, which in turn require precise control of the composition of the gas mixture.

Unfortunately, gas contamination occurs during operation of excimer and molecular fluorine lasers due to the aggressive nature of the fluorine or chlorine in the gas mixture. The halogen gas is highly reactive and its concentration in the gas mixture decreases as it reacts, leaving traces of contaminants. The halogen gas reacts with materials of the discharge chamber or tube as well as with other gases in the mixture. Moreover, the reactions take place and the gas mixture degrades whether the laser is operating (discharging) or not. The passive or static gas (i.e., when the laser is not discharging, or operating) lifetime is about one week for a typical KrF-laser.

During operation of a KrF-excimer laser, such contaminants as HF, $CF_4$, $COF_2$, $SiF_4$ have been observed to increase in concentration rapidly (see G. M. Jurisch et al., *Gas Contaminant Effects in Discharge-Excited KrF Lasers*, Applied Optics, Vol. 31, No. 12, pp. 1975–1981 (Apr. 20, 1992)) For a static KrF laser gas mixture, i.e., with no discharge running, increases in the concentrations of HF, $O_2$, $CO_2$ and $SiF_4$ have been observed (see Jurisch et al., above).

One way to effectively reduce this gas degradation is by reducing or eliminating contamination sources within the laser discharge chamber. With this in mind, an all metal, ceramic laser tube has been disclosed (see D. Basting et al., *Laserrohr für halogenhaltige Gasentladungslaser*" G 295 20 280.1, Jan. 25, 1995/Apr. 18, 1996 (disclosing the Lambda Physik Novatube, and hereby incorporated by reference into the present application)). FIG. 6 qualitatively illustrates how using a tube comprising materials that are more resistant to halogen erosion (plot B) can slow the reduction of $F_2$ concentration in the gas mixture compared to using a tube which is not resistant to halogen erosion (plot A). The $F_2$ concentration is shown in plot A to decrease to about 60% of its initial value after about 70 million pulses, whereas the $F_2$ concentration is shown in plot B to decrease only to about 80% of its initial value after the same number of pulses. Gas purification systems, such as cryogenic gas filters (see U.S. Pat. No. 4,534,034) or electrostatic particle filters (see U.S. Pat. No. 5,586,134) are also being used to extend KrF laser gas lifetimes to 100 million shots before a new fill is advisable.

It is not easy to directly measure the halogen concentration within the laser tube for making rapid online adjustments (see U.S. Pat. No. 5,149,659 (disclosing monitoring chemical reactions in the gas mixture)). Therefore, it is recognized in the present invention that an advantageous method applicable to industrial laser systems includes using a known relationship between $F_2$ concentration and a laser parameter, such as one of the $F_2$ concentration dependent output beam parameters mentioned above. In such a method, precise values of the parameter would be directly measured, and the $F_2$ concentration would be calculated from those values. In this way, the $F_2$ concentration may be indirectly monitored.

Methods have been disclosed for indirectly monitoring halogen depletion in a narrow band excimer laser by monitoring beam profile (see U.S. Pat. No. 5,642,374) and spectral (band) width (see U.S. Pat. No. 5,450,436). Neither of these methods is particularly reliable, however, since beam profile and bandwidth are each influenced by various other operation conditions such as repetition rate, tuning accuracy, thermal conditions and aging of the laser tube. That is, the same bandwidth can be generated by different gas compositions depending on these other operating conditions.

It is known to compensate the degradation in laser efficiency due to halogen depletion by steadily increasing the driving voltage of the discharge circuit to maintain the output beam at constant energy. To illustrate this, FIG. 7 shows how at constant driving voltage, the energy of output laser pulses decreases with pulse count. FIG. 8 then shows how the driving voltage may be steadily increased to compensate the halogen depletion and thereby produce output pulses of constant energy.

One drawback of this approach is that output beam parameters other than energy such as those discussed above with respect to FIGS. 1–5 affected by the gas mixture degradation will not be correspondingly corrected by steadily increasing the driving voltage. FIGS. 9–11 illustrate this point showing the driving voltage dependencies, respectively, of the long and short axis beam profiles, short axis beam divergence and energy stability sigma. Moreover, at some point the halogen becomes so depleted that the driving voltage reaches its maximum value and the pulse energy cannot be maintained without refreshing the gas mixture.

It is desired to have a method of stabilizing all of the output parameters affected by halogen depletion and not just the energy of output pulses. It is recognized in the present invention that this is most advantageously achieved by adjusting the halogen and rare gas concentrations themselves.

There are techniques available for replenishing a gas mixture by injecting additional rare and halogen gases into the discharge chamber and readjusting the gas pressure (see U.S. Pat. No. 5,396,514). A more complex system monitors gas mixture degradation and readjusts the gas mixture using selective replenishment algorithms for each gas of the gas mixture (see U.S. Pat. No. 5,440,578). A third technique uses an expert system including a database of information and graphs corresponding to different gas mixtures and laser operating conditions (see U.S. patent application Ser. No. 09/167,653, assigned to the same assignee as the present application and hereby incorporated by reference into the present application). A data set of driving voltage versus output pulse energy, e.g., is measured and compared to a stored "master" data set corresponding to an optimal gas composition such as may be present in the discharge chamber after a new fill. From a comparison of values of the data sets and/or the slopes of graphs generated from the data sets, a present gas mixture status and appropriate gas replenishment procedures, if any, may be determined and undertaken to reoptimize the gas mixture. Some gas replenishment procedures are described in U.S. Pat. No. 4,977,573, which is assigned to the same assignee as the present application and is hereby incorporated by reference into the present application.

All of these techniques generally produce undesirable disturbances in laser operation conditions when the gas is replenished. For example, strong pronounced jumps of the driving voltage are produced as a result of halogen injections (HI) as illustrated in FIG. 12. The result is a strong distortion of meaningful output beam parameters such as the pulse-to-pulse stability. For this reason, the laser is typically shut down and restarted for gas replenishment, remarkably reducing laser uptime (see U.S. Pat. No. 5,450,436).

SUMMARY OF THE INVENTION

It is an object of the invention to provide an excimer or molecular laser system, wherein the gas mixture status may be precisely and periodically determined and smoothly adjusted.

It is a further object of the invention to provide a technique which automatically compensates gas mixture degradation without disturbing laser operation conditions when the gas is replenished.

It is another object of the invention to provide an excimer or molecular laser system capable of running continuously while maintaining constant output beam parameters.

A gas discharge laser system is provided to meet the above objects which has a discharge chamber containing a first gas mixture including a constituent gas, a pair of electrodes connected to a power supply circuit including a driving voltage for energizing the first gas mixture, and a resonator surrounding the discharge chamber for generating a laser beam. A gas supply unit is connected to the discharge chamber for replenishing the first gas mixture including the constituent gas. The gas supply unit includes a gas inlet port having a valve for permitting a second gas mixture to inject into the discharge chamber to mix with the first gas mixture therein. A processor monitors a parameter indicative of the partial pressure of the constituent gas and controls the valve at successive predetermined intervals to compensate a degradation of the constituent gas in the first gas mixture. The pressure of the first gas mixture is increased by an amount between 0.01 and 10 mbar, and preferably between 0.1 and 1 or 2 mbar, as a result of each successive injection. The second gas mixture preferably comprises 1% of the first constituent gas, preferably a halogen containing species, and 99% buffer gas, so that the partial pressure of the constituent gas in the discharge chamber increases by between 0.0001 and 0.1 mbar, and preferably between 0.001 and 0.01 or 0.02 mbar, as a result of each successive injection. The processor monitors the parameter indicative of the partial pressure of the constituent gas wherein the parameter varies with a known correspondence to the partial pressure of the constituent gas. The small gas injections each produce only small variations in partial pressure of the constituent gas in the first gas mixture, and thus discontinuities in laser output beam parameters are reduced or altogether avoided.

A method is also provided for stabilizing laser output by maintaining a constituent gas of the laser gas mixture at a predetermined partial pressure within the discharge chamber of the gas discharge laser using a gas supply unit and a processor. The method begins with providing a laser gas mixture including a constituent gas at an initial partial pressure which is subject to depletion within the discharge chamber. Next, a parameter which varies with a known correspondence to the partial pressure of the constituent gas is monitored. A value of the parameter corresponding to a selected partial pressure or partial pressure reduction of the constituent gas is selected and injections of the constituent gas, or a gas mixture including the constituent gas, are performed when predetermined values or changes in value of that parameter are measured. The gas pressure within the discharge chamber is increased by between 0.01 and 10 mbar, or preferably between 0.1 and 1 or 2 mbar, with each injection, when a gas mixture including around 1% of the constituent gas is injected. The constituent gas partial pressure increases by between 0.0001 and 0.1 mbar, or preferably between 0.001 and 0.01 and 0.02 mbar, with each injection. The injections are performed at intervals sufficient to maintain or return the constituent gas substantially at or to the initial partial pressure within the laser gas mixture.

The constituent gas is typically a halogen containing species such as fluorine or hydrogen chloride. The constituent gas may be an active rare gas or gas additive. The monitored parameter is preferably selected from the group including time, pulse count, total accumulated energy input to the discharge, driving voltage for maintaining a constant laser beam output energy, pulse shape, pulse duration, pulse stability, beam profile, bandwidth of the laser beam, energy stability, moving average energy close, temporal pulse width, temporal coherence, spatial coherence, discharge width, and long and short axial beam profiles and divergences, or a combination thereof. Each of these parameters varies with a known correspondence to the partial pressure of the halogen, and that halogen partial pressure is then precisely controlled using the small gas injections to provide stable output beam parameters.

In the present invention, the gas supply unit preferably includes a small gas reservoir for storing the constituent gas or second gas mixture prior to being injected into the discharge chamber (see U.S. Pat. No. 5,396,514, which is assigned to the same assignee as the present application and is hereby incorporated by reference into the present application, for a general description of how such a gas reservoir may be used). The reservoir may be the volume of the valve assembly or an additional accumulator. The accumulator is advantageous for controlling the amount of the gas to be injected. The pressure and volume of the second gas mixture are selected so that the pressure in the discharge chamber will increase by a predetermined amount less than 10 mbar, and preferably between 0.1 and 2 mbar, with each injection. These preferred second gas mixture partial pressures may be varied depending on the percentage concentration of the halogen containing species in the second gas mixture.

Injections may be continuously performed during operation of the laser in selected amounts and at selected small intervals. Alternatively, a series of injections may be performed at small intervals followed by periods wherein no injections are performed. The series of injections followed by the latent period would then be repeated at predetermined larger intervals.

BRIEF DESCRIPTION OF THE DRAWINGS

FIG. 13a shows a schematic block diagram of an excimer or molecular laser in accord with the present invention.

FIG. 13b shows a schematic diagram of the gas control unit of the excimer or molecular laser of FIG. 13a.

FIG. 21 is a qualitative graph of driving voltage versus pulse count also showing periodic halogen injections, mini gas replacements and partial gas replacements for a system in accord with the present invention.

DETAILED D)DESCRIPTION OF THE PREFERRED EMBODIMENT

Figure 1:
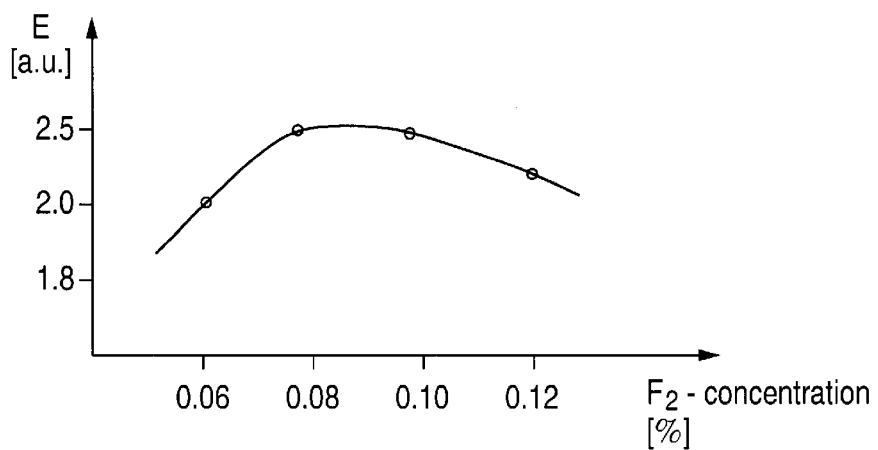
FIG. 1 is a graph of the output efficiency of an excimer or molecular laser versus $F_2$-concentration.
Figure 2:
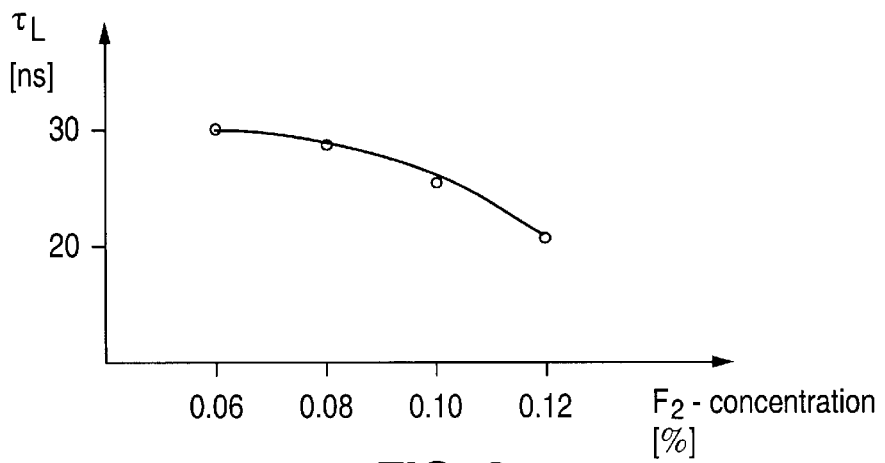
FIG. 2 is a graph of integrated pulse width of an excimer or molecular laser versus $F_2$-concentration
Figure 4:
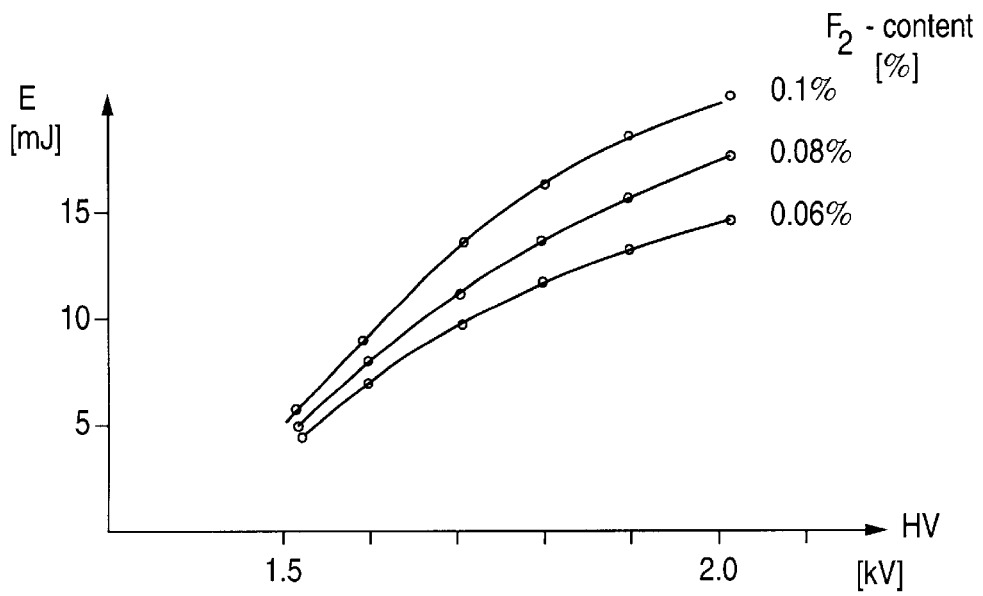
FIG. 4 shows several graphs of output beam energy of an excimer or molecular laser versus driving voltage for various $F_2$-concentrations.
Figure 3:
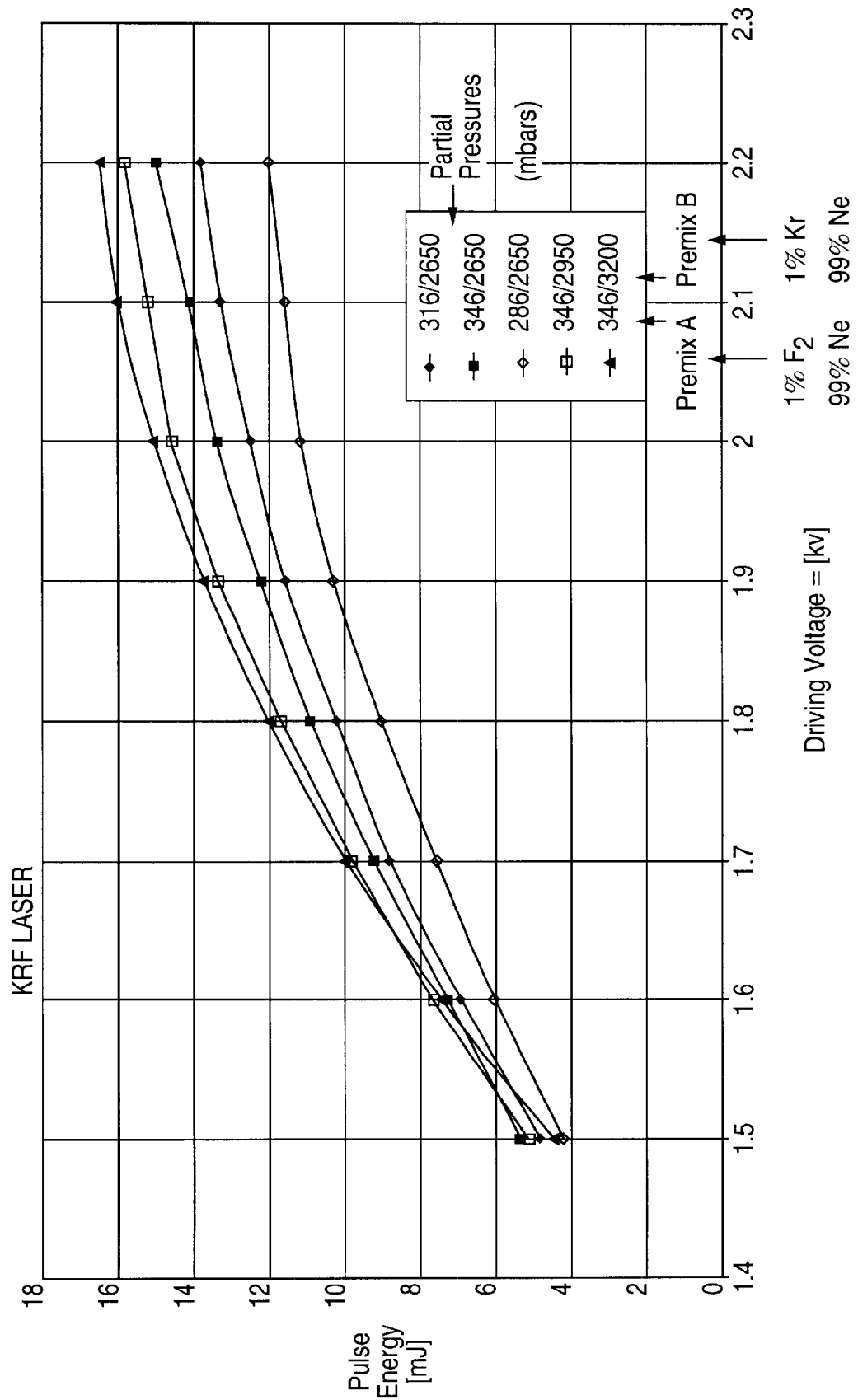
FIG. 3 shows several graphs of output beam energy of a KrF excimer laser versus driving voltage for various gas mixture component partial pressures.
Figure 5:
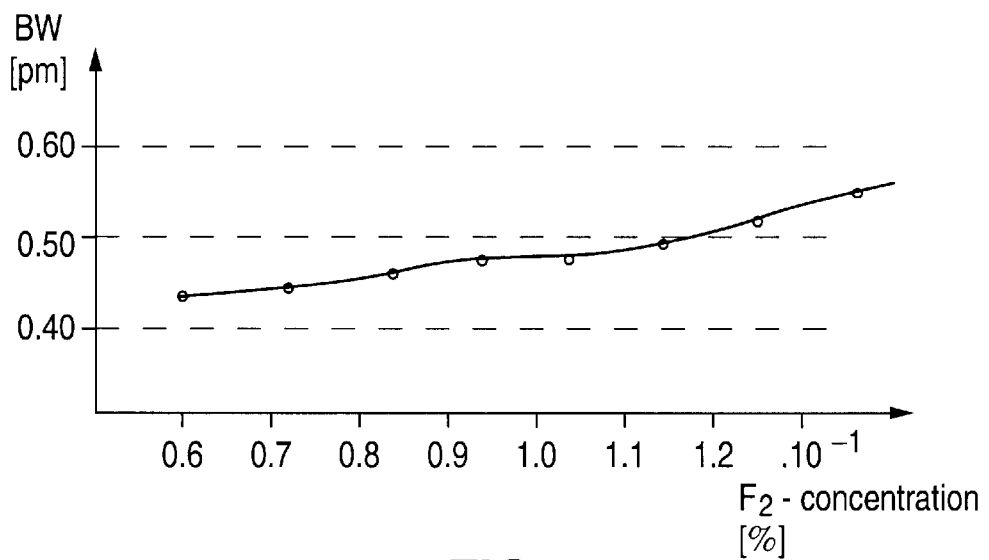
FIG. 5 is a graph of the bandwidth of an excimer laser versus $F_2$-concentration.
Figure 6:
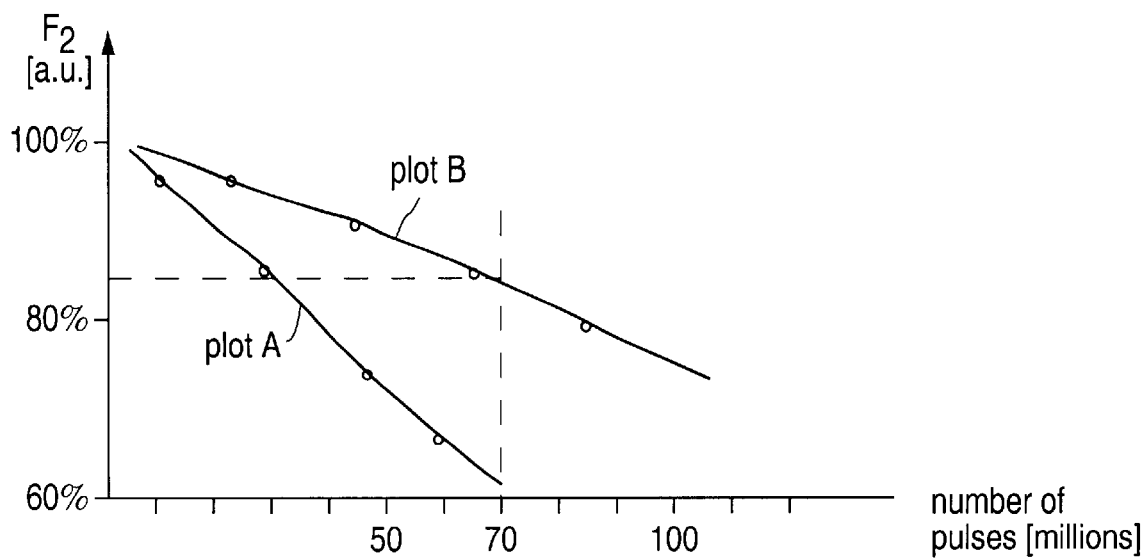
FIG. 6 illustrates how $F_2$ depletion rates vary for excimer or molecular lasers depending on discharge chamber composition.
Figure 7:
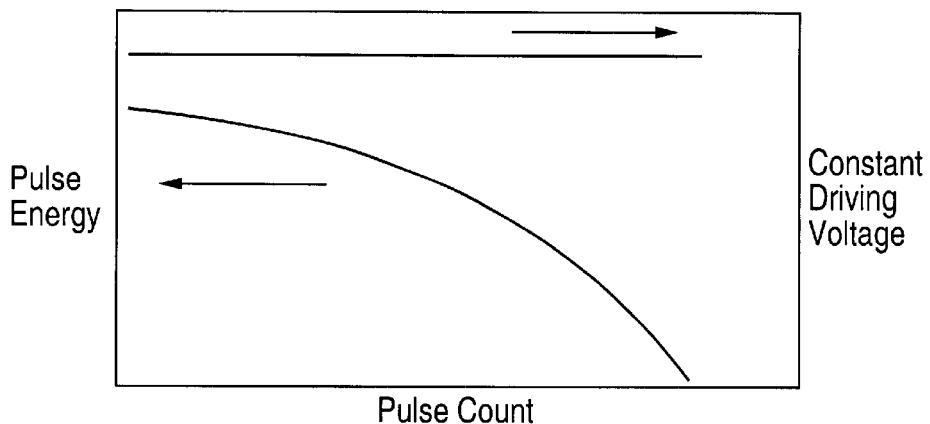
FIG. 7 is a graph of pulse energy versus pulse count for an excimer or molecular laser operating at constant driving voltage.

FIG. 13a shows a schematic block diagram of a preferred embodiment of an excimer or molecular fluorine laser in accord with the present invention. The laser system of FIG. 13a includes a laser tube 1 including an electrode or discharge chamber and a gas flow vessel, wherein the gas flow vessel typically includes a blower and heat exchanger or cooling unit. The laser tube 1 contains a laser gas mixture, and a pressure gauge P is preferably provided for monitoring the pressure in the laser tube 1. A resonator surrounds the tube 1 and includes a rear optics module 2 and a front optics module 3.

The rear optics module 2 includes a resonator reflector which may be a highly reflective mirror, a grating or a highly reflecting surface of another optical component such as an etalon or a prism. A wavelength calibration module is preferably included with one of the optics modules. Preferred wavelength calibration units or devices and techniques are disclosed in U.S. Pat. No. 4,905,243 and U.S. patent applications Ser. Nos. 09/136,275, 09/167,657 and 09/179,262, each of which is assigned to the same assignee as the present application and is hereby incorporated by reference into the present application.

The front optics module 3 preferably includes a resonator reflector which is preferably an output coupler. The resonator reflector of the front optics module may alternatively be a highly reflecting mirror and other means for output coupling the beam 13 may be used, such as a beam splitter or other angled partially reflecting surface within the resonator. The front optics module 3 also may include a line narrowing and/or selection unit and/or a wavelength tuning unit.

Alternatively, the line narrowing and/or selection unit and/or wavelength tuning unit may be included with the rear optics module. Such optical elements as one or more beam expanding elements such as beam expanding prism(s) and/or lens arrangements, one or more dispersive elements such as dispersive prism(s) and/or a grating, one or more etalons, birefringent plate(s), or grism(s) may be included for line narrowing, selection and/or tuning. U.S. Pat. No. 5,761,236 and U.S. patent applications Ser. No. 09/244,554, 09/130, 277, 60/124,804, 60/124,241 and 60/140,532, each of which is assigned to the same assignee as the present invention and is hereby incorporated by reference into the present, describe line narrowing, selection and/or tuning elements, device and/or techniques which may be used in the present invention.

Wavelength, pulse energy, and gas control information, as well as other information about the laser system is received by a processor 11. The processor 11 controls the wavelength of the output beam 13 by controlling the line tuning module based on the wavelength information the processor 11 receives, the electrical pulse power and discharge module ("pulse power module") 5 based on pulse energy information it receives, and gas control elements 6–10 and 12 based on information it receives relating to the gas mixture status, and on data saved in its database(s) (see the '653 application, above).

A beam portion is preferably received by an energy monitor 4 which measures -the energy of the received beam portion output beam 13. Data corresponding to the energy of the beam portion is then sent to the processor 11 which is connected to the energy monitor 4. The processor 11 then uses this information to determine and/or perform functions such as controlling the driving voltage and/or the wavelength and/or bandwidth or controlling gas actions relating to one or more parameters (see above) such as the energy of the output beam 13.

The pulse power module 5 provides energy to the gas mixture via a pair of electrodes 14 within the discharge chamber 1. Preferably, a preionization unit (not shown) is also energized by the pulse power module for preionizing the gas mixture just prior to the main discharge. The energy of the output beam 13 of the laser system has a known dependence on the "driving voltage" of the pulse power module. The driving voltage is adjusted during laser operation to control and stabilize the energy of the output beam 13. The processor 11 controls the driving voltage based on the energy information received from the energy monitor 4. In accord with the present invention, the processor 11 also controls and stabilizes the status of the gas mixture and thus indirectly controls and stabilizes other laser output beam parameters such as energy stability, temporal pulse width, spatial and temporal coherences, bandwidth, and long and short axial beam profiles and divergences by controlling the status of the gas mixture within the laser tube 1.

Figure 13B:
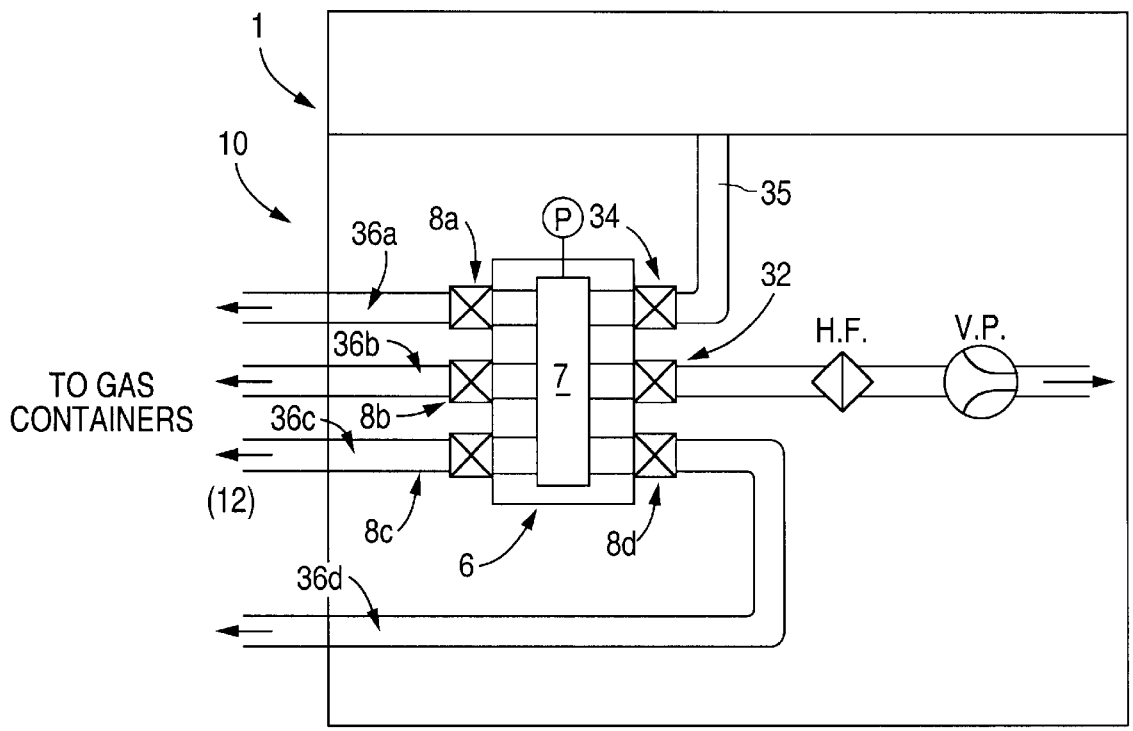

FIG. 13b shows a detailed schematic of the gas control box 10 of FIG. 13a. The gas control box 10 is connected to the laser tube 1 for supplying gas based on control signals received from the processor 11. The processor 11 regulates the delivery of gases or mixtures of gases to the laser tube 1 via a valve assembly 6 or system of valves. The valve assembly preferably has a reservoir or compartment 7 having a known volume and having a pressure gauge P attached for measuring the pressure in the compartment 7. The compartment 7 may be 20 cm$^3$ or so in volumetric size (by contrast, the laser tube 1 may be 42,000 cm$^3$ volumetrically). Four valves 8a–8d are shown as controlling the flow of gases contained in external gas containers into the compartment 7. Of course, more or less than four such valves may be provided. Another valve 32 is shown controlling the access of a vacuum pump VP to the compartment 7 which is shown connected through a halogen filter HF. Another valve 34 is shown controlling the flow of gases between the compartment 7 and the laser tube 1. A further valve or valves (not shown) may be provided along the line 35 from valve 34 to the tube 1 for controlling the atmosphere in the line 35, e.g., using a pump for evacuating the line 35.

Small amounts of a gas or gas mixture are preferably injected from the compartment 7 into the discharge chamber 1. As an example, the gas supply connected to the valve assembly 6 through gas line 36a may be a premix A including 1%$F_2$:99%Ne, and that through gas line 36b may be a premix B including 1% Kr:99% Ne, for a KrF laser. For an ArF laser, premix B would have Ar instead of Kr, and for a $F_2$ laser pure buffer gas is used. Thus, by injecting premix A and premix B into the tube 1 via the valve assembly, the fluorine and krypton concentrations in the laser tube 1, respectively, may be replenished. Gas lines 36c and 36d may be used for different additional gas mixtures. Although not shown, the tube 1 preferably has additional means for releasing gas, or alternatively, the gas is released through the valve assembly, such as via valves 34 and 32. New fills, partial and mini gas replacements and gas injection procedures, e.g., micro-halogen injections, and any and all other gas replenishment actions are initiated and controlled by the processor 11 which controls the valve assembly 6 and the pump VP based on various input information in a feedback loop.

An exemplary method according to the present invention is next described for accurately and precisely replenishing the fluorine concentration in the laser tube 1 in small amounts such that significant output beam parameters are not significantly disturbed, if at all, with each gas injection. The processor 11, which is monitoring a parameter indicative of the fluorine concentration in the laser tube 11, determines that it is time for a micro-halogen injection (HI).

The processor 11 then sends a signal that causes valve 8*a* to open and allow premix A to fill the compartment 7 to a predetermined pressure, e.g., 5 bar. Then, valve 8*a* is closed and valve 34 is opened allowing at least some of the premix A that was filled into the compartment 7 to release into the laser tube 1.

If the pressure in the tube was 3 bar prior to the injection and the tube has about 40,000 cm$^3$, and the injection is such that the pressure in the accumulator was reduced to 3 bar after the injection, then 2×20/40,000 bar would be the pressure increase in the tube 1 as a result of the injection, or 1 mbar. If the premix A contains 1%$F_2$:99%Ne, then the increase in partial pressure of the $F_2$ in the laser tube as a result of the injection would be approximately 0.01 mbar.

The above calculation may be performed by the processor 11 to determine more precisely how much $F_2$ was injected, or prior to injection, the pressure in the compartment 7 may be set according to a calculation by the processor 11 concerning how much $F_2$ should be injected based on the status information of the monitored parameter received by the processor 11, or based on pre-programmed criteria. A correction for difference in temperature between the gas in the compartment 7 and that in the tube 1 may also be performed by the processor 11 for more accuracy, or the temperature of the gas in the compartment 7 may be preset, e.g., to the temperature within the laser tube 1.

Preferably, an amount of gas premix corresponding to smaller than 10 mbar total gas pressure, or 0.1 mbar $F_2$ partial pressure, increase in the tube 1 is injected from the compartment 7. Even more preferably, less than 5 mbar or even 2 mbar total gas pressure (0.05 or 0.02 mbar $F_2$ partial pressure) increase in the laser tube 1 results from the gas injection.

The compartment 7 may simply be the valve assembly 6 itself, or may be an additional accumulator (described in detail below). The compartment 7 is also configured so that the small amounts of gas may be injected at successive very short intervals, to compensate a degradation of a halogen gas and/or another gas or gases within the discharge chamber 1 of an excimer or molecular laser such as a KrF, ArF or $F_2$ laser.

There may be more than one compartment like compartment 7, as described above, each having different properties such as volumetric space. Different premixes may be injected from the different compartments. Also, the exemplary method described using premixes of particular gas compositions, but many different gas compositions could be used in accord with the present invention. For example, gas compositions having higher fluorine (or hydrogen chloride) percentage concentrations could be used such as 5% instead of 1%. There also may be an additional valve connected to a 100% buffer gas container.

Advantageously, the processor 11 and gas supply unit are configured to permit the delivery or injection of very small amounts of one or more gases or gas mixtures to the discharge chamber 1. The injection of the small amounts of the gas or gas mixture result in gas pressure increases in the discharge chamber 1 below 10 mbar, and preferably between 0.1 and 2 mbar. Each gas in the gas mixture within the discharge chamber 1 may be separately regulated so the gas composition within the discharge chamber may be precisely controlled. For example, similar injections of Kr, Ar or Xe may be performed for replenishing those gases in the laser tube 1.

Because the amount of gas injected during a gas injection or replacement procedure is small laser output beam parameters do not vary greatly with each injection. The injections are preferably carried out periodically at predetermined intervals corresponding to known depletion amounts of the gases. For example, if the halogen partial pressure in the gas mixture of an $F_2$ laser is known, under current operating conditions, to be around 3 mbar after a new fill and to deplete by 0.1 mbar per X minutes or Y shots, then halogen injections including, e.g., 1 mbar (pressure increase in tube 1) of a premix including 1% $F_2$ could be performed every X/10 minutes or Y/10 shots, in accord with the present invention, to maintain the concentration of the halogen, or halogen injections of 2 mbar of the premix may be performed every X/5 minutes, and so on. Also, micro-halogen injections ($\mu$HI) of 1 mbar of premix A including 1% $F_2$ and 99% Ne buffer may be injected every X/5 minutes for 100 minutes followed by a period of 100 minutes when no injections are performed. Many variations are possible within the spirit of the present invention including irregular gas actions as determined by the processor.

In contrast with the present invention, if, e.g., a 50 mbar (pressure increase in tube 1) premix A injection (again having 1% $F_2$ such that the $F_2$ partial pressure increase in the tube 1 is 0.5 mbar and corresponds to around a 17% increase in the $F_2$ concentration in the tube 1) is performed every 5X minutes or 5Y shots, or at any time, the large injection amount will cause output beam parameters of the laser beam to noticeably and undesirably fluctuate in response. For example, the pulse energy or driving voltage can fluctuate by 10% or more when the large injection is performed. If the laser is not shut down, or industrial processing interrupted, when the large injection is performed, then imprecise industrial processing will occur due to disturbances in meaningful output beam parameters.

A factor that is preferably taken in account in determining the above particulars of the next gas action is the specific amount of halogen that was injected during the previous gas action. That amount may be determined based on measurements of the gas pressure in an accumulator (see the '785 application) from which the gas was injected during the previous gas action (and optionally also based on the pressure in the laser tube). The temperatures of the gas mixtures in the laser tube and the accumulator may also be taken into account.

The valve assembly preferably has a reservoir or compartment 7 having a known volume and having a pressure gauge P attached for measuring the pressure in the compartment 7. The compartment as well as the laser tube preferably also each have means, such as a thermocouple arrangement, for measuring the temperature of the gases within the compartment and tube.

Figure 14A:
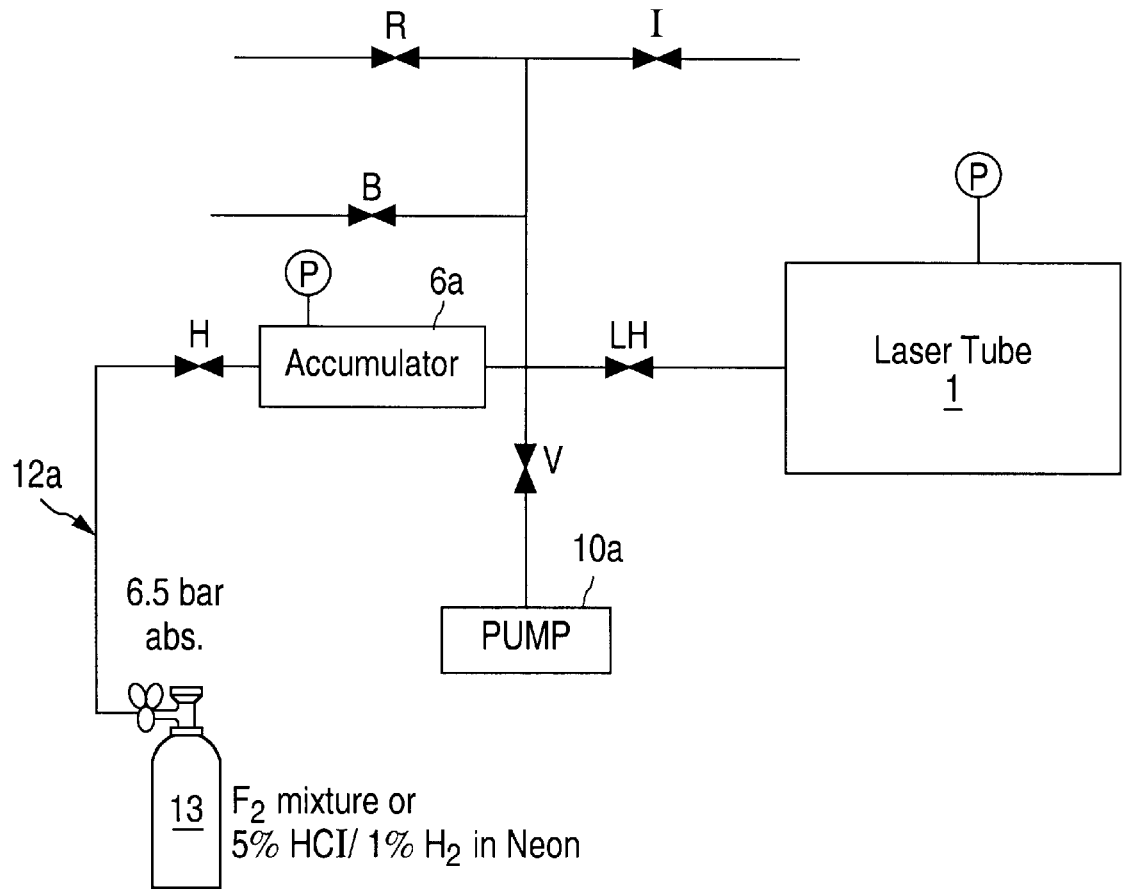
FIG. 14a schematically shows gas lines for halogen injections into the discharge chamber of the laser of FIG. 13 using an accumulator.
Figure 14B:
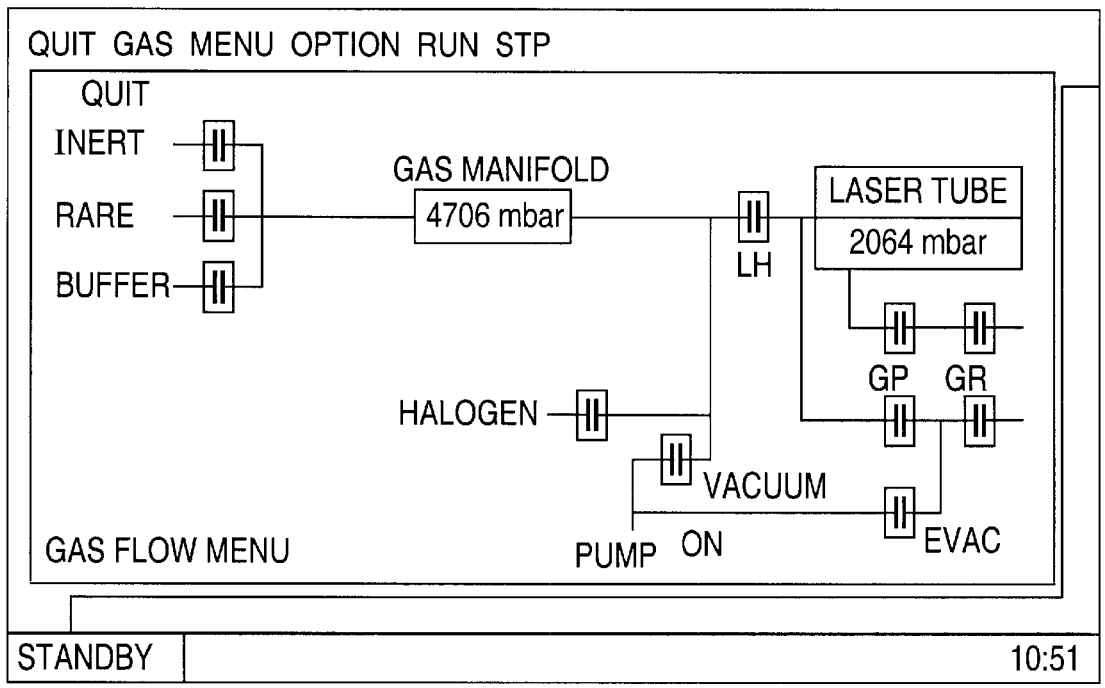
FIG. 14b shows gas lines and valves as visualized on a computer display connected to the processor of FIG. 13a indicating that the processor is controlling the gas replenishment process.

FIG. 14b shows how a display monitor attached to the processor 11 might look as the laser system is operating. The laser tube is shown to have an internal pressure of 2064 mbar, while the pressure within the gas manifold (corresponding to the compartment 7 of FIG. 13a or the accumulator 6a of FIG. 14a) shows an internal pressure of 4706 mbar. As discussed, the precise amount of gas injected into the laser tube can be calculated based in part on these pressure readings. Again, the temperature may be taken into account for making an even more precise determination.

The interval between the current and next injection is set based on any one or a combination of parameters such as the driving voltage or any of the output beam parameters described above. In addition, the amount of halogen injected in the current injection and/or the interval between the previous and current injection may be taken into account.

The amount of halogen injected in any $\mu$HI or enhanced $\mu$HI may be determined in accord with the present invention by measuring the pressure in the accumulator (see FIGS. 13b and 14a) and the laser tube at the time of the injection, and/or just before, and/or just after the injection. The temperatures of the gases in the accumulator and tube may be measured as well. The interior volumes of the tube and accumulator are known in advance. The well-known formula $PV = Nk_B T$ is used to calculate the amount of halogen injected into the tube during any injection.

For example, if the accumulator has a measured halogen partial pressure $P_a$, and temperature $T_a$, and a volume $V_a$, then the accumulator contains $N_a$ fluorine molecules. If all of the $N_a$ molecules are injected into the laser tube during the injection, and the tube has a temperature $T_T$ and volume $V_T$, then the change in fluorine partial pressure in the tube as a result of the injection will be $\Delta P(F_2)_T = P_a V_a T_T / V_T T_a$. Since it is desired to maintain the total number of fluorine molecules in the tube, then it may be more appropriate to calculate the change in the number of fluorine molecules in the tube, i.e., $\Delta N(F_2)_T = \Delta P(F_2)_T V_T / k_B T_T$, and keep track of that quantity. Then, the amount of halogen and/or the interval before the next injection is determined based on the calculated amount of halogen that was injected in the previous injection, the partial pressure of the halogen in the tube after the previous injection and/or the amount of halogen that it is desired to have in the tube after the next injection.

The overall calculation depends also on the amount of depletion that the halogen gas has undergone (or will undergo) between injections. Such depletion is, in principal, known as a function of many factors, e.g., including time and pulse count (and possibly any of the parameters enumerated above or others). For example, a change in halogen partial pressure (or, alternatively, the number of halogen molecules) in the laser tube in the interval between injections can be calculated to depend on $k_t \times \Delta t$ and on $k_p \times \Delta p$, wherein $k_t$ and $k_p$ are constants that depend on the rate of halogen depletion with time and pulse count, respectively, and $\Delta t$ and $\Delta p$ are the amount of time and the number of pulses, respectively, in the interval under consideration. The number of pulses $\Delta p$ itself depends on the repetition rate, taking into account also the number of pulses in a burst and the pause intervals between bursts for a laser operating in burst mode. Again, other parameters may have an effect and may be additive terms included with this calculation.

Now, from one interval to the next, a calculation could be performed as follows. The increase (or decrease reflected as a negative sum) in fluorine partial pressure in the laser tube over the interval is calculated to be: $\Delta P(F_2)_{interval} \approx \Delta P(F_2)_{T\ injection} - k_t \times \Delta t - k_p \times \Delta p$. Again, since it is the total number of fluorine molecules that it is desired to keep constant, then a calculation of the change in the number of molecules is calculated as: $\Delta N(F_2)_{interval} \approx \Delta N(F_2)_{T\ injection} - k_t \times \Delta t - k_p \times \Delta p$, where the constants $k_t$ and $k_p$ would differ from the partial pressure calculation by a units conversion.

The overall algorithm would seek to maintain the total number of halogen molecules (or halogen partial pressure) constant. Thus, the changes in particle number (or partial pressure) would be summed continuously over many intervals, or preferably all intervals since the last new fill. That overall sum would be maintained as close as possible to zero, in accord with the present invention.

The halogen injection algorithm of the present invention may be considered to extend a total halogen injection over a longer period of time or number of pulse counts. Over the period of the several halogen injections, the high voltage and the $F_2$ concentration do not change significantly so that significant changes in pulse energy and pulse energy stability, among other meaningful output beam parameters, are eliminated. Again, some of these other output beam parameters are listed above and each will be extremely stable using the method of the present invention.

FIG. 14a schematically shows another configuration of gas lines for halogen injections into the discharge chamber 1 of the laser of FIG. 13a using an accumulator 6a. The accumulator 6a is connected to the laser tube 1 via laser head valve LH. The accumulator 6a is also connected to a gas line 12a via halogen valve H connected to a gas bottle 13 including the halogen or halogen premix. For example, the gas bottle 13 may be filled with a gas mixture including an $F_2$ mixture (e.g., 5% $F_2$/95%/c, Ne or a 5% HCl/ 1% $H_2$ in neon mixture or a 1% $F_2$:99% Ne premix, among other possibilities). A pump 10a is shown connected to each of the accumulator 6a and the laser tube 1 via a vacuum valve V. The tube 1 is shown valve-connected to additional gas lines and valves including a buffer gas via valve B, a rare gas or rare gas premix via valve R (used with KrF, ArF, XeCl and XeF excimer lasers, e.g.) and an inert gas via valve I. The inert gas valve I or another valve not depicted may be used for valve connecting to a source of Xe to be used as an additive in the gas mixture within the tube.

The accumulator 6a has the particular advantage that the small amounts of gas including the $F_2$ within the $F_2$ premix to be injected with each halogen injection in accord with the present invention may be precisely controlled. The accumulator is easily pumped to low pressure. A precise amount of $F_2$ gas or $F_2$ gas premix is released into the accumulator 6a and the amount of $F_2$ is determined according to the total gas pressure within the accumulator, the known volumes of the accumulator 6a and the laser tube 1 and the known concentration of the $F_2$ or the $F_2$ percentage concentration in the premix gas. A $F_2$ partial pressure increase in the laser tube 1 after the injection is determined based on the amount of $F_2$ known to be in the accumulator 6a prior to (and possible after) the injection.

FIG. 14b shows how a display monitor attached to the processor 11 might look as the laser system is operating. The laser tube is shown to have an internal pressure of 2064 mbar, while the pressure within the gas manifold (corresponding to the compartment 7 of FIG. 13a or the accumulator 6a of FIG. 14a) shows an internal pressure of 4706 mbar. As discussed, the precise amount of gas injected into the laser tube can be calculated based in part on these pressure readings.

Various gas actions and procedures are will now be described. The procedures are potentially applicable to all gas discharge lasers, although excimer lasers (e.g., KrF, ArF, XeCl and XeF) and the $F_2$ laser would benefit greatly by the present invention. The KrF-laser is used as a particular example below.

The process begins with a new fill which is performed prior to operating the laser system. For a new fill, the laser tube 1 is evacuated and a fresh gas mixture is then filled in. A new fill of a KrF-laser would typically result in a gas mixture having approximately the following partition of gases: $F_2$: Kr: Ne=0.1%: 1.0%: 98.9%. If the gas mixture within the KrF laser discharge chamber has a typical total pressure of around p=3000 mbar, then the partial pressures of $F_2$ and Kr would typically be around 3 mbar and 30 mbar, respectively. A new fill for a $F_2$ laser would produce the following typical partition of gases: $F_2$: Ne=0.1%: 99.9%. For the $F_2$ laser, He or a mixture of He and Ne may be used as the buffer instead of only Ne (see the '526 application, above)

The new fill procedure can be performed using separate gas lines delivering pure or premixed gases. Typical gas premixes used regularly in semiconductor industry fabs are premixes A and B, where: premix A has 1% $F_2$/1% Kr/Ne and premix B has 1% Kr/Ne.

After the new fill is performed, the halogen gas begins to react with components of the laser tube 1 that it comes into contact with, whether the laser is operating or not. "Gas replenishment" is a general term which includes gas replacement and gas injection, and is performed to bring the gas mixture status back closer to new fill status.

Any replenishment procedures are performed taking into account that each gas in the gas mixture depletes at a different depletion rate due to the halogen depletion just described and the gas replenishment procedures performed in response. For the narrow band KrF-laser, e.g., $F_2$-depletion occurs at a rate of between about 0.1% to 0.3% (and sometimes up to nearly 1%) per million shots, whereas Kr depletion occurs about 10 to 50 times more slowly. The Ne buffer is less important, but may also be considered as part of an overall gas replenishment operation, e.g., to maintain a desired pressure in the tube 1.

Separate gas actions are preferably performed to replenish each constituent gas of the gas mixture. For the KrF-laser, for example, the $F_2$ may be replenished by halogen or halogen/rare gas or premix A injections and the Kr replenished by rare gas or premix B injections. The individual depletion rates also depend on operating conditions of the laser such as whether the laser is in broadband or narrow band mode, the operating energy level, whether the laser is turned off or is in continuous, standby or other burst pattern operation, and the operating repetition rate. The processor 11 is programmed to consider all of these variations in laser operation.

The gas mixture status is considered sufficiently stable in the present invention when deviations in fluorine and krypton content are below 5%, and preferably below 3%. Without any gas replenishment actions, after 100 million shots the partial pressures of $F_2$ and Kr might degrade by between 10% and 100% and between 0.5% and 5%, respectively.

To compensate for the various depletion rates of the gases in the discharge chamber, the present invention performs a variety of separate and cross-linked gas replenishment procedures, which take into account the variety of individual degradation rates by referring to a comprehensive database of different laser operating conditions. A preferred technique is disclosed in the '653 application already mentioned above. The behavior of the particular laser in operation and related experiences with gas degradation under different operating conditions are stored in that database and are used by a processor-controlled "expert system" to determine the current conditions in the laser and manage the gas replenishment or refurbishment operations.

As mentioned above, series of small gas injections (referred to as micro gas or halogen injections, or HI) can be used to return any constituent gas of an excimer or molecular laser, particularly the very active halogen, to its optimal concentration in the discharge chamber without disturbing significant output beam parameters. However, the gas mixture also degrades over time as contaminants build up in the discharge chamber. Therefore, mini gas replacements (MGR) and partial gas replacements (PGR) are also performed in the preferred methods. Gas replacement generally involves releasing some gas from the discharge chamber, including expelling some of the contaminants. MGR involves replacement of a small amount of gas periodically at longer intervals than the small HIs are performed. PGR involves still larger gas replacement and is performed at still longer periodic intervals. The precise intervals in each case depend on consulting current laser operating conditions and the expert system and comprehensive database. The intervals are changes of parameters which vary with a known relationship to the degradation of the gas mixture. As such, the intervals may be one or a combination of time, pulse count or variations in driving voltage, pulse shape, pulse duration, pulse stability, beam profile, coherence, discharge width or bandwidth. Each of HI, MGR and PGR may be performed while the laser system is up and running, thus not compromising laser uptime.

Three exemplary gas replenishment methods for stabilizing an optimum gas mixture are described below. Many other methods are possible including combinations of the ones described below. The methods and parameters used may also be varied during the laser operation depending on the laser operating conditions and based on the data base and the expert system. The processor and gas supply unit are configured to perform many methods based on a comprehensive database of laser operating conditions and gas mixtures statuses.

Each method involves well-defined very small gas actions with small, successive gas injections preferably by injecting a premix of less than 10 mbar and more preferably between 0.1 and 2 mbar including a concentration including preferably 5% or less of the halogen containing species in order not to disturb the laser operation and output beam parameters. Whatever the composition of the premix, it is the amount of the halogen in the premix that is most significant. That is, the preferred amount of the halogen containing species that is injected in the small gas actions preferably corresponds to less than 0.1 mbar and more preferably between 0.001 and 0.02 mbar partial pressure increase in the laser tube 1.

The first exemplary gas stabilization method involves performing gas injections based on operation time. The method takes into account whether or not the laser is operating, i.e., whether the laser system is up and performing industrial processing, in standby mode, or simply shut off. The first method is thus useful for maintaining either an active or a passive gas composition status. Time-correlated $\mu$HI, MGR and PGR are performed according to a selectable time interval based on operating conditions. For example, $\mu$HIs may be performed after time intervals $t_1$, MGRs after time intervals $t_2$, and PGRs after time intervals $t_3$.

Below, detailed graphs are described for an operating laser system in accord with the present invention. Typically, gas actions occur after several hours if the laser is in the standby-mode without pulsing or pulsing with low repetition rate (<100 Hz). If the laser is completely switched off (power-off-mode), a battery driven internal clock is still running and the expert system can release an adequate, time controlled number of injections during the warm-up phase after restarting the laser. The number and amount of the injections can be also related to certain driving voltage start conditions which initiate a preferred sequence of gas actions to reestablish optimum gas quality.

Figure 15:
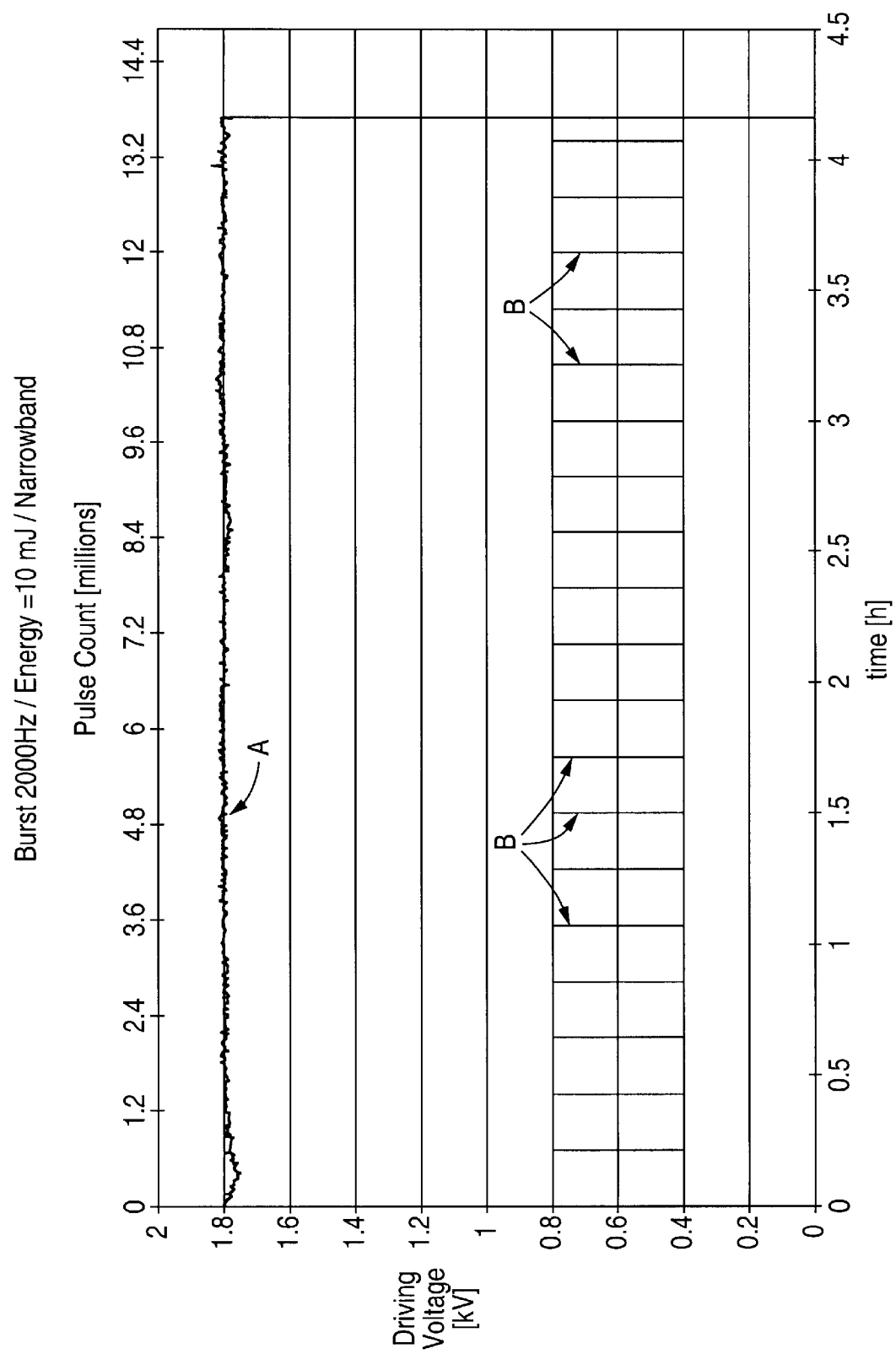
FIG. 15 is a graph of driving voltage versus time also showing periodic halogen injections (B) for a system in accord with the present invention (gas actions are illustrated by periodic vertical lines).
Figure 16:
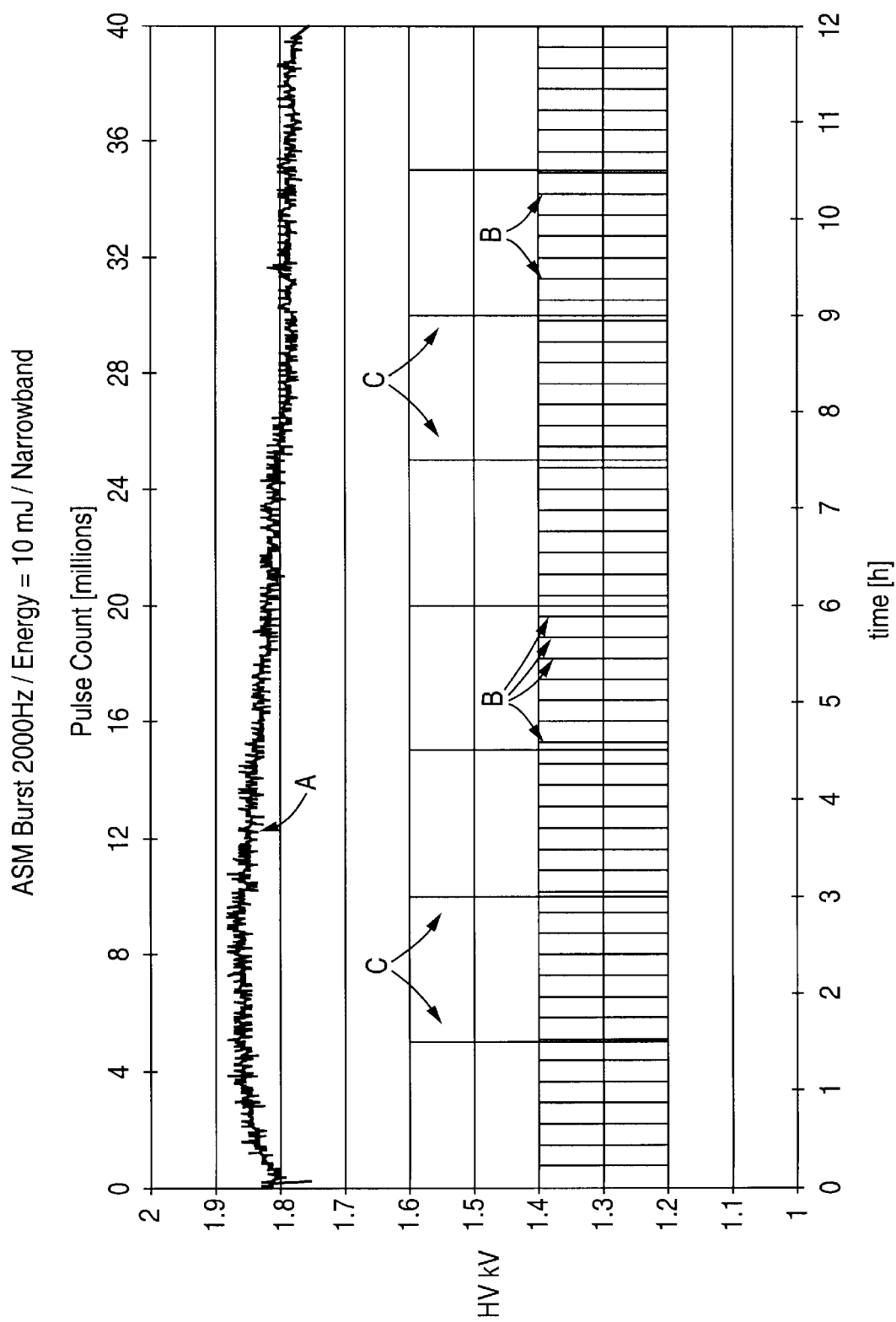
FIG. 16 is a graph of driving voltage versus time also showing periodic halogen injections (B) and mini gas replacements (C) for a system in accord with the present invention (gas actions are again illustrated by vertical lines, this time different height vertical lines indicating different types of gas actions).

FIGS. 15 and 16 are graphs of driving voltage versus time also showing periodic $\mu$HI and periodic $\mu$HI and MGR, respectively, for a fully operating system in accord with the present invention. FIG. 15 includes a plot of driving voltage versus time (A) wherein $\mu$HIs are performed about every 12 minutes, as indicated by the vertical lines (some of which are designated for reference with a "B") on the graph, for a narrowband laser running in 2000 Hz burst mode at 10 mJ output beam energy. The vertical axis only corresponds to graph A. As is shown by graph A, the small $\mu$HIs produce no noticeable discontinuities in the driving voltage.

FIG. 16 is a plot (labelled "A") of driving voltage versus time wherein $\mu$HIs are performed about every 12 minutes, as indicated by the short vertical lines on the graph (again, some of which are designated for reference with a "B" and the vertical axis doesn't describe the halogen injections in any way), and MGR is performed about every 90 minutes, as indicated by the taller vertical lines on the graph (some of which are designated with a "C" for reference and again the vertical axis is; insignificant in regard to the MGRs shown), for a narrowband laser running in 2000 Hz burst mode at 10 mJ output beam energy. Again, the driving voltage is substantially constant around 1.8 KV and no major changes, e.g., more than %5, are observed.

Figure 8:
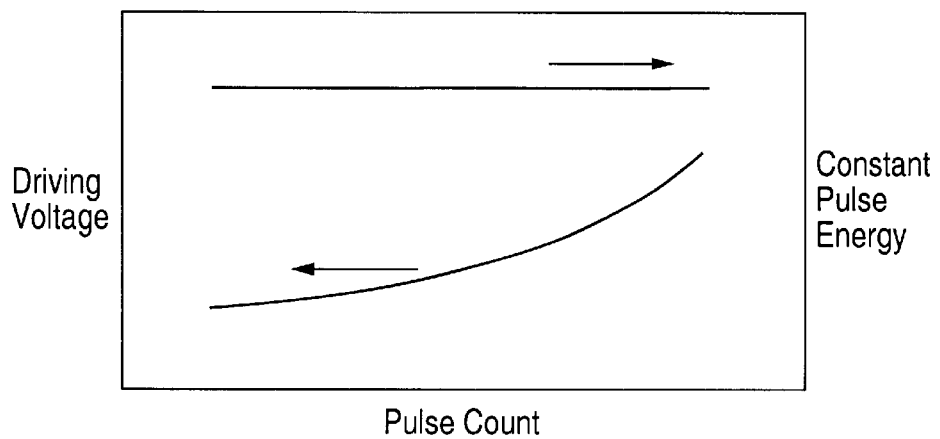
FIG. 8 is a graph of driving voltage versus pulse count for an excimer or molecular laser operating at constant output pulse energy.
Figure 12:
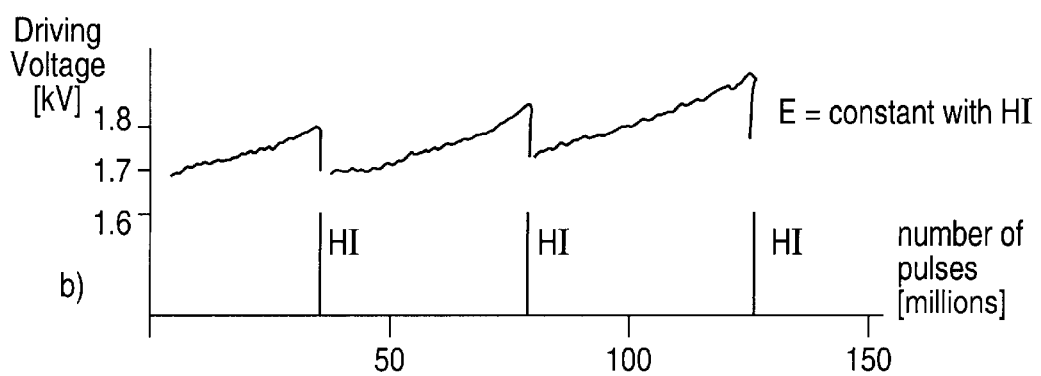
FIG. 12 illustrates the strong pronounced discontinuities in the driving voltage when large halogen partial pressures increases are effected in the discharge chamber due to halogen injections.

A comparison of FIGS. 15 and 16 with FIG. 8 or FIG. 12 reveals that the present invention advantageously avoids the conventional approach which drastically increases the driving voltage as the gas mixture degrades. By avoiding discontinuities, fluctuations or changes in the driving voltage in this way, disturbances of meaningful output beam parameters are also avoided.

Figure 17:
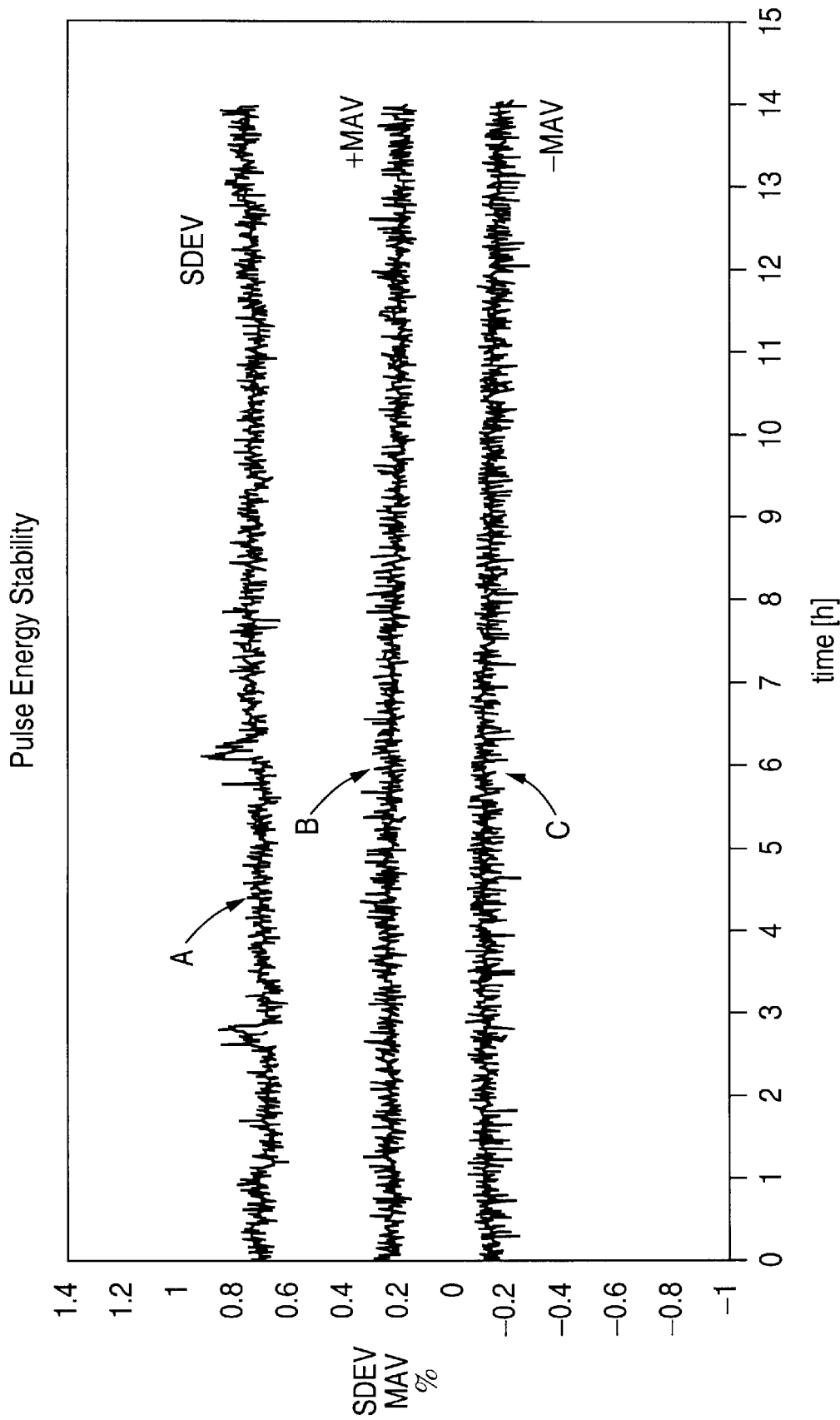
FIG. 17 is a graph of pulse energy stability (sigma, upper graph) versus time and moving averages (over 40 pulse intervals, worst, maximum and minimum) for a laser system operating at 2 kHz in accord with the present invention.

FIG. 17 includes graphs of pulse energy stability versus time of the laser pulses by values of standard deviation (SDEV) (graph labeled "A") and moving average stabilities (±MAV) (graphs labeled "B" and "C") as percentages of the absolute pulse energy for a system in accord with the present invention. The graphs labelled "B" and "C" show the moving average for groups of 40 pulses each. During this run, micro-halogen injections were performed resulting in very stable continuous laser operation without any detectable deviations caused by the gas replenishment actions.

The second exemplary gas stabilization method involves performing gas injections based on shot or pulse count using a shot or pulse counter. After certain numbers of laser pulses, e.g., N(HI), N(MGR), and N(PGR), depending again on the mode of operation of the laser, HI, MGR and PGR can be respectively performed. Typically, the HIs amount to about 0.5 . . . 2.0 mbar of fluorine premix (e.g., 1–5% $F_2$:95–99% Ne) for the KrF, ArF, XeF or $F_2$ lasers (Ne being replaceable with He or a mix of He and Ne) or HCl premix (e.g., 1–5% HCl:1% in Ne or He) for XeCl or krCl laser and are released after several hundred thousand or even after millions of laser shots. Each HI just compensates the halogen depletion since the last gas action and typically corresponds to less than 0.1 mbar of the halogen containing species and more preferably between 0.001 and 0.02 mbar partial pressure increase in the laser tube 1 per, e.g., 1 million shots. The actual amounts and shot intervals vary depending on the type of laser, the composition and age of the discharge chamber, the original gas mixture composition and operating mode, e.g., energy, or repetition rate, being used.

The shot counter can also be used in combination with time related gas replenishment. The shot counter can be for different laser pulse operation modes, e.g., burst patterns, or continuous pulsing modes at different pulse repetitions wherein a number of individual shot counters $N_i(HI)$ are used. All of these different shot-counters can be stored in the data base of the expert system. Which of the different shot counters $N_i(HI)$ is to be used at any time is determined by the software of the expert system.

Figure 18:
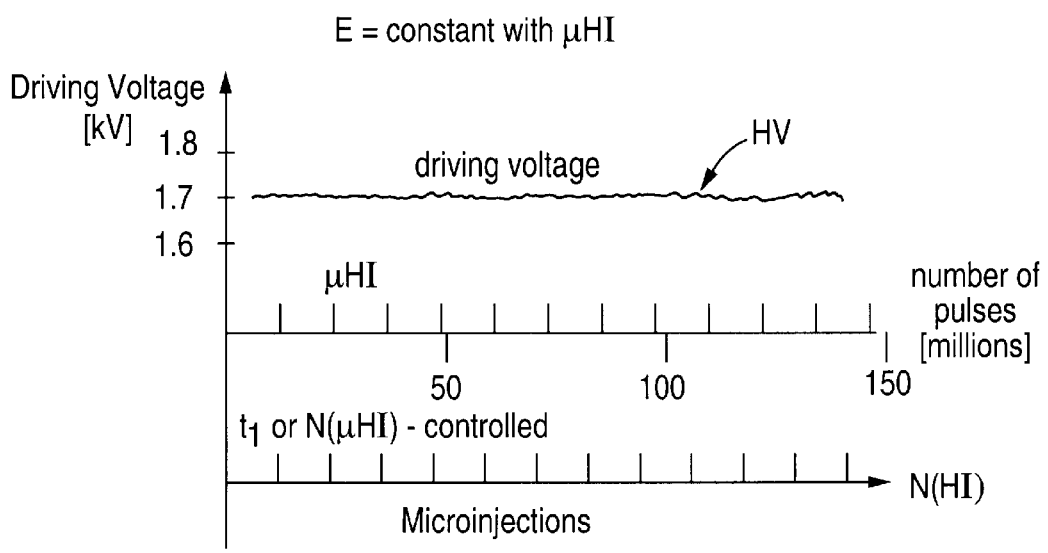
FIG. 18 is qualitative graph of driving voltage versus time also showing periodic micro-halogen injections ($\mu$HI) for a system in accord with the present invention.

FIG. 18 illustrates qualitatively a driving voltage free of discontinuities when small partial pressure increases are effected in the laser discharge chamber due to HIs in accord with the present invention. The driving voltage is shown as being substantially constant at around 1.7 KV over 150 million pulses, while HIs are performed about once every 12 million pulses. The pulse energy is also maintained at a constant level.

Figure 9:
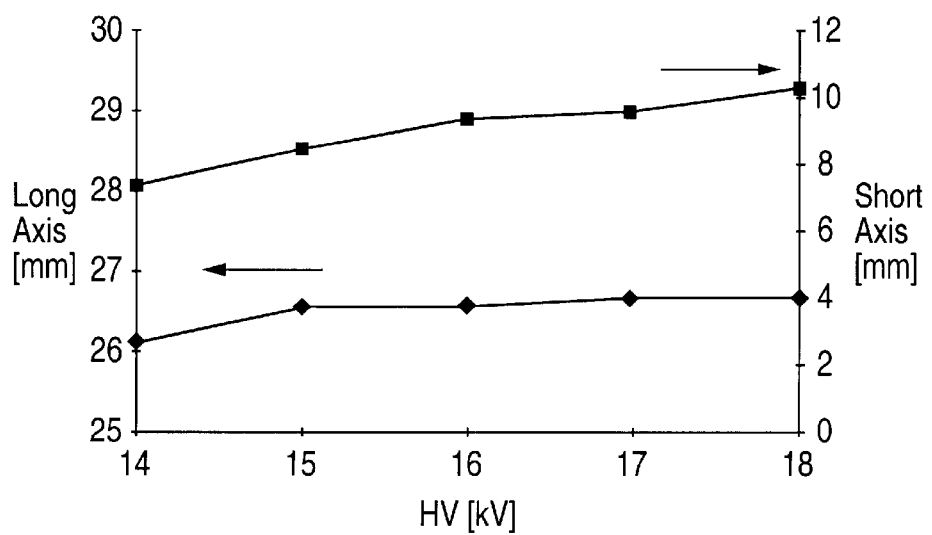
FIG. 9 shows a first graph of the long axis beam profile versus driving voltage and a second graph of the short axis beam profile versus driving voltage for an excimer or molecular laser operating at constant output pulse energy.
Figure 10:
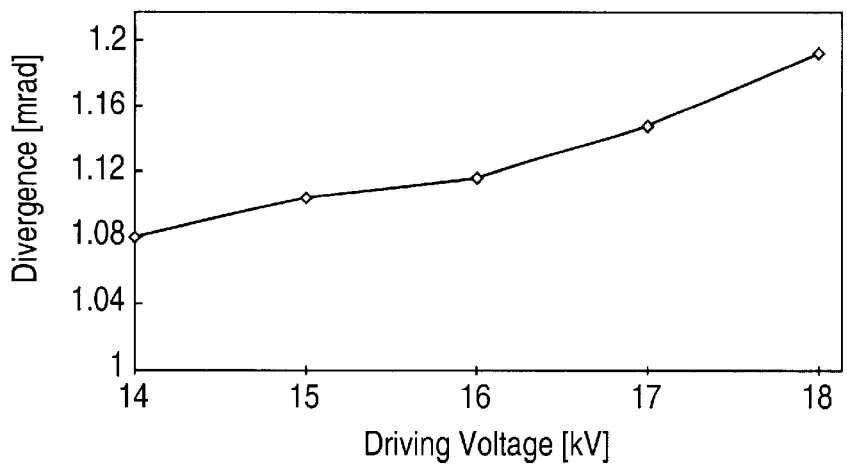
FIG. 10 is a graph of the divergence of the short axis of an output beam versus driving voltage of an excimer or molecular laser operating at constant output pulse energy.
Figure 11:
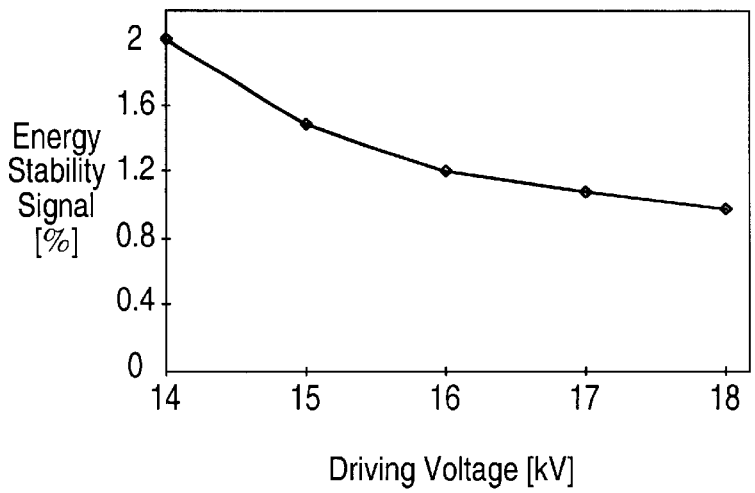
FIG. 11 is a graph of output pulse energy stability versus driving voltage of an excimer or molecular laser operating at constant output pulse energy.

A comparison of FIG. 18 with the driving voltage graph of FIG. 12 shows an advantage of the present invention. In FIG. 12 the driving voltage is observed to increase steadily until a halogen injection (HI) is performed, and is then observed to drop precipitously when the halogen is injected in a large amount in accord with conventional gas replenishment. These disturbances in the driving voltage curve of FIG. 12 occur because the intervals for the HIs are too large and the amounts of halogen injected are thus too large to prevent the disturbances. As can be deduced from FIGS. 9–11, these large driving voltage disturbances undesirable affect meaningful output beam parameters. FIG. 18, on the other hand, shows no fluctuations in the driving voltage in response to micro-halogen injections performed in accord with the present invention.

Figure 19:
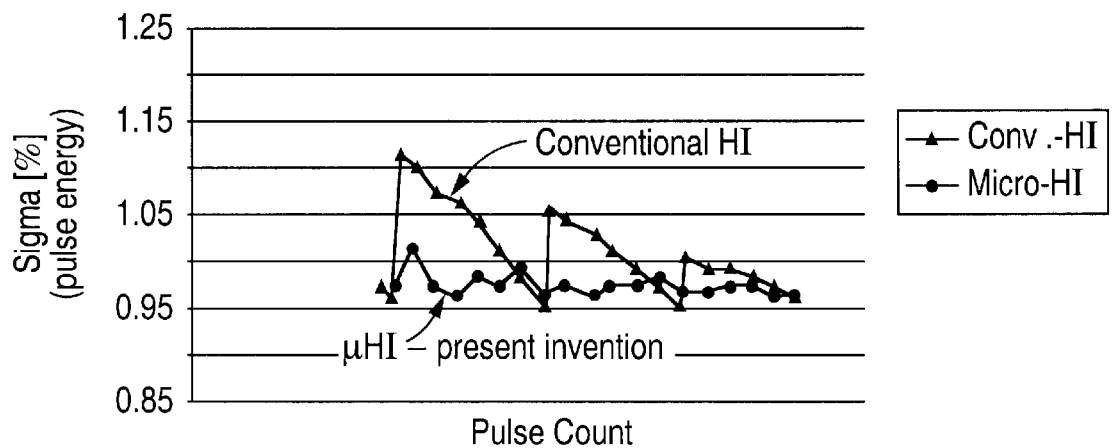
FIG. 19 is a graph of energy stability variation versus pulse count for comparison of a system in accord with the present invention with a conventional system not using micro halogen injections.

FIG. 19 is a graph including two plots. The first plot following the darkened triangles and labelled "convention HI" is the energy stability variation versus pulse count for a system using a conventional HI algorithm and shows sharp discontinuities in the energy stability. For example, the first HI is shown to produce a leap from 0.95% to 1.10% almost instantaneously in response to the HI. The second plot following the darkened circles and labelled "HI-present invention" is the energy stability variation versus pulse count for a system using a HI algorithm in accord with the present invention wherein discontinuities are substantially minimized in the energy stability.

Figure 20:
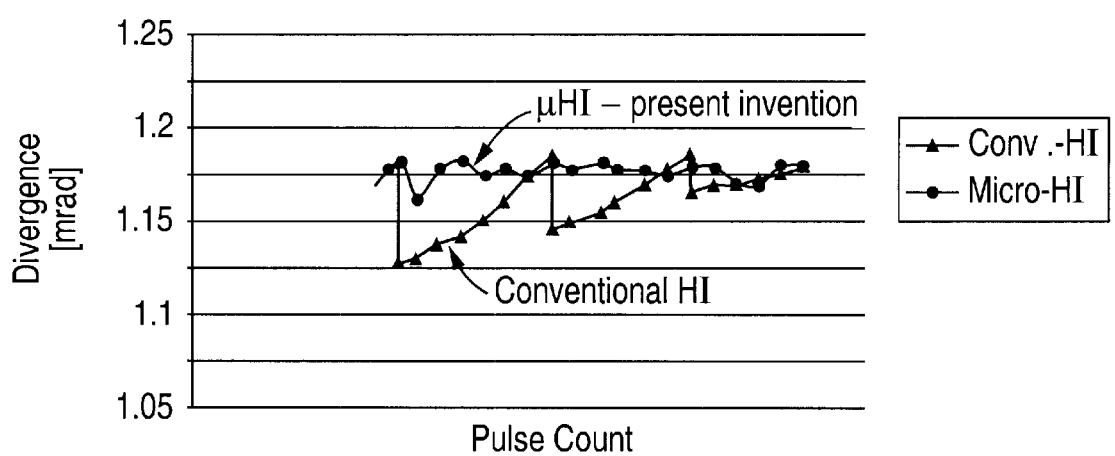
FIG. 20 is a graph of beam divergence versus pulse count for a comparison of a system in accord with the present invention with a conventional system not using micro halogen injections.

FIG. 20 is a graph also including two plots. The first plot following the darkened triangles and labelled "conventional HI" is the beam divergence versus pulse count for a system using a conventional HI algorithm and shows sharp discontinuities in the beam divergence.

For example, the first HI is shown to produce a sharp drop from 1. 175 mrad to 1.125 mnrad almost instantaneously in response to the HI. The second plot following the darkened circles and labelled "$\mu$HI-present invention" is the beam divergence versus pulse count for a system using a HI algorithm in accord with the present invention wherein discontinuities are substantially minimized in the beam divergence.

The expert system can use a different kind of shot counter, e.g., N(MGR) and/or N(PGR) for other types of gas actions (i.e., different from the N($\mu$HI)). MGR and PGR replace or substitute different gases of the gas mixture in the laser tube by predetermined amounts. As mentioned, MGR and PGR include a gas injection accompanied by a release of gases from the laser tube, whereas μHI do not involve a release of gases. Gas releases can be performed simply to reduce the pressure in the laser tube, as well as for expelling contaminants from the gas mixture. Unequal degradations of the individual gas components within the gas mixture are nicely compensated using MGR and PGR, and again, different numbers $N_t(MGR)$ and $N_t(PGR)$ may be used for different operating modes and conditions as determined by the expert system. All these settings, i.e., $N_t(\mu HI)$, $N_t(MGR)$, $N_t(PGR)$ and the separately selectable portions of injections for each gas can be adapted for the aging of the laser tube, taking into account changing conditions of gas consumption and replenishments as it ages. The amount of compensation can be pre-selected by manual settings or based on settings in the data base of the computer controlled expert system. For MGR, like μHI, the portions of injected gases amount to a few mbar (or percent only). The MGR is combined with a small pressure release of some 10 mbar of the pressure of the tube.

More than one gas may be injected or replaced in the same gas action. For example, a certain amount of halogen and a certain amount of an active rare gas for an excimer laser may be injected together into the laser tube. This injection may be accompanied by a small pressure release as with MGR. Alternatively, this mixture of the halogen and rare gases may simply be injected to increase the partial pressure of each gas within the discharge chamber without any accompanying release of gases.

The third exemplary gas stabilization method involves performing gas injections based on operating driving voltage values of the laser. This method may especially be combined with either of both of the first and second exemplary methods. The time related $t_1(HI)$, $t_2(MGR)$, $t_3(PGR)$ and the counter-related $N_t(\mu HI)$, $N_t(MGR)$, $N_t(PGR)$ gas actions generally operate in a certain operation band of the driving voltage.

Referring to FIG. 21, several driving voltage levels ($HV_i$) can be defined based on which additional other gas actions may be performed. For example, when the driving voltage HV is below $HV_1$ (i.e., $HV<HV_1$) no gas actions are performed as there is a sufficient amount of halogen in the gas mixture. When the driving voltage is between $HV_1$ and $HV_2$ (i.e., $HV_1<HV<HV_2$), $MGR_1$ and μHI are performed periodically. When the driving voltage is between $HV_2$ and $HV_{repl}$ (i.e., $HV_2>HV>HV_{repl}$), a larger amount $MGR_2$ than the usual amount $MGR_1$, as well as the μHIs, are performed periodically to recondition the gas mixture. When the driving voltage is above $HV_{repl}$ (i.e., $HV>HV_{repl}$), a still greater gas replacement PGR may be implemented.

PGR may be used to replace up to ten percent or more of the gas mixture. Certain safeguards may be emplaced to prevent unwanted gas actions from occurring when, for example, the laser is being tuned. One is to allow a certain time to pass (such as several minutes) after the $HV_2$ or $HV_{repl}$ level is crossed before the gas action is allowed to be performed, thus ensuring that the driving voltage actually increased due to gas mixture degradation.

Figure 22:
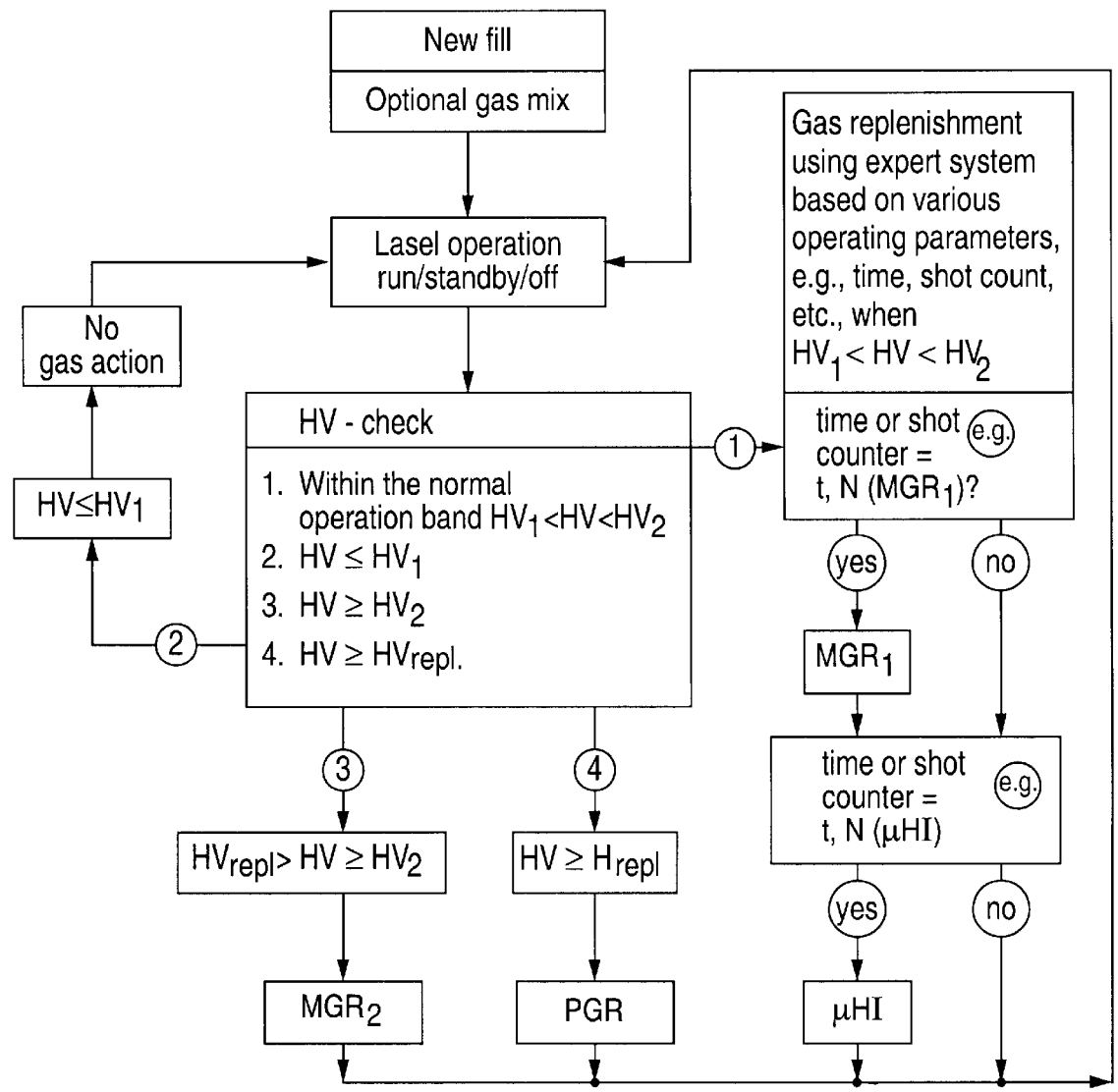
FIG. 22 is a flow diagram for performing halogen injections, mini gas replacements and partial gas replacements in accord with the present invention.

FIG. 22 is a flow diagram for performing μHI, MGR and PGR in accord with the third exemplary method. The procedure starts with a new fill, wherein the discharge chamber is filled with an optimal gas mixture. The laser can thereafter be in operation for industrial applications, in stand-by mode or shut off completely. A driving voltage check (HV-check) is performed after the current driving voltage (HV) is measured.

The measured driving voltage (HV) is compared with predetermined values for $HV_1$, $HV_2$ and $HV_{repl}$. The processor determines whether HV lies between $HV_1$ and $HV_2$ (i.e., $HV_1<HV<HV_2$) and is thus within the normal operating driving voltage band. If it is within the normal operating band, then path (1) is followed whereby μHIs and $MGR_1$ are performed based preferably on time and/or pulse count intervals as predetermined by the expert system based on operating conditions.

The μHIs and $MGR_1$ performed when path (1) is followed may be determined in accordance with any method set forth in U.S. patent application Ser. No. 09/167,653, already incorporated by reference. If HV is not within the normal operating band, then it is determined whether HV lies below $HV_1$ (i.e., $HV<HV_1$). If HV is below $HV_1$, then path (2) is followed and no gas actions are performed.

If HV lies between $HV_2$ and $HV_{repl}$ (i.e., $HV_2>HV>HV_{repl}$), then path (3) is followed and $MGR_2$ is performed. The precise amounts and compositions of gases that are injected and those that are released are preferably determined by the expert system and will depend on operating conditions.

If HV lies above $HV_{repl}$ (i.e., $HV>HV_{repl}$), then path (4) is followed and PGR is performed. Again, the precise amounts and compositions of gases that are injected and those that are released are preferably determined by the expert system and will depend on operating conditions. After any of paths (1)–(4) is followed and the corresponding gas actions are performed, and preferably after a specific settling time, the method returns to the step of determining the operating mode of the laser and measuring and comparing HV again with the predetermined HV levels $HV_1$, $HV_2$ and $HV_{repl}$.

The setting of all of these different driving voltage levels and time and pulse count schedules can be done individually or can refer to the computer controlled data base where they are stored for different operation conditions. The operation of the laser at different HV-levels under different operation conditions such as continuous pulsing or burst mode may be taken into consideration.

The combination of all of these different kinds of gas control and replenishment mechanisms involves harmonizing many factors and variables. Combined with the expert system and database, the processor controlled laser system of the present invention offers an extended gas lifetime before a new fill is necessary. In principle, bringing down the laser system for new fill might be totally prevented. The lifetime of the laser system would then depend on scheduled maintenance intervals determined by other laser components such as those for laser tube window or other optical components exchange.

The above described gas replenishment procedures may be combined with cryogenic gas purification techniques, whereby contaminants such as rare gas fluorides, i.e., $AF_n$ molecules, where A=Xe and n=2, 4 or 6) or other contaminants as mentioned above are removed from the gas mixture. For this purpose, U.S. Pat. Nos. 5,001,721, 5,111,473, 5,136,605 and 5,430,752 are hereby incorporated by reference into the present application. Standard methods typically include using a cold trap to freeze out contaminants before recycling the gas back into the discharge chamber. The contaminants are molecular compounds of the halogen gas of excimer lasers. Thus, a significant amount of halogen is removed from the gas mixture in the discharge chamber. The result is a rapid decrease in halogen gas concentrations undesirably affecting output beam parameters.

In summary, the present invention provides a method and procedure for stabilizing an original or optimal gas composition of a gas discharge laser, and particularly an excimer or molecular (e.g., $F_2$) laser. During a long period of operation of the laser in a running or stand-by mode, the depletion of the laser gas is continuously monitored by monitoring and controlling the high voltage, laser pulse shape, elapsed time after new fill or other additional laser parameters some of which have been set forth above. According to a database of known histories and trends of key operating parameters for various laser operating under various conditions, a processor controlled procedure is applied to replenish the gas degradation. The stabilization process involves using a number of tiny gas actions (micro injections) performed preferably based on specified time, driving voltage change and/or shot count intervals, a combination thereof or some other interval relating to a parameter which changes with a known relationship to the gas mixture degradation. A careful combination of $\mu$HI, MGR(s) and PGR are used to effect very nearly complete stabilization of the laser gas mixture over an unlimited duration. Most importantly, the gas actions described herein do not disturb meaningful output beam parameters or operation of the laser, because they are smooth and controlled based on an expert system comprising myriad operating conditions of the laser system. Thus, the laser can operate without interruption during the gas replenishment actions and industrial processing can be performed with high efficiency.

The specific embodiments described in the specification, drawings, summary of the invention and abstract of the disclosure are not intended to limit the scope of any of the claims, but are only meant to provide illustrative examples of the invention to which the claims are drawn. The scope of the present invention is understood to be encompassed b,y the language of the claims, and structural and functional equivalents thereof.

What is claimed is:

1. A gas discharge laser system, comprising:
   a discharge chamber containing a laser gas mixture a least including fluorine, which is subject to depletion, and a buffer gas;
   a pair of electrodes connected to a power supply circuit including a driving voltage for providing a pulsed discharge to energize said laser gas mixture;
   a resonator surrounding said discharge chamber for generating a pulsed laser beam;
   a gas supply unit connected to said discharge chamber; and
   a processor for controlling gaseous flow between said gas supply unit and said discharge chamber,
      a compartment valve-coupled between the gas supply unit and the discharge chamber for storing said fluorine prior to injecting into said discharge chamber,
      wherein said gas supply unit, said compartment and said processor are configured to permit between 0.0001 mbar and 0.2 mbar of said fluorine to inject said discharge chamber at selected interval.

2. The laser system of claim 1 wherein said gas supply unit and said processor are configured to permit between 0.001 mbar and 0.1 mbar of said first constituent gas to inject into said discharge chamber at selected intervals.

3. The laser system of claim 1, wherein said gas supply unit and said processor are configured to permit between 0.0001 mbar and 0.05 mbar of said first constituent gas to inject into said discharge chamber at selected intervals.

4. The laser system of claim 1, wherein said gas supply unit and said processor are configured to permit between 0.0001 mbar and 0.02 mbar of said first constituent gas to inject into said discharge chamber at selected intervals.

5. The laser system as in any of claims 1–4, in which said selected intervals are based at least in part on time.

6. The laser system of claim 5, wherein said time intervals are between 5 seconds; and five hours.

7. The laser system of claim 5, wherein said time intervals are between 5 seconds and 30 minutes.

8. The laser system of claim 5, wherein said time intervals are between 5 seconds and 20 minutes.

9. The laser system as in any of claims 1–4, in which said selected intervals are selected numbers of pulses.

10. The laser system of claim 9, wherein said pulse intervals are between 10,000 and ten million.

11. The laser system of claim 9, wherein said pulse intervals are between 10,000 and one million.

12. The laser system as in any of claims 1–4, in which said selected intervals are based at least in part on changes in driving voltage for maintaining a constant laser beam output energy.

13. The laser system of claim 12, wherein said driving voltage change intervals are between 0.5% and 10%.

14. The laser system of claim 12, wherein said driving voltage change intervals are between 0.1% and 5%.

15. The laser system of claim 12, wherein said driving voltage change intervals are between 0.01% and 5%.

16. The laser system as in any of claims 1–4, in which said selected intervals are based at least in part on combinations of changes in time and driving voltage for maintaining a constant laser beam output energy.

17. The laser system as in any of claims 1–4, in which said selected intervals are based at least in part on combinations of changes in pulse count and driving voltage for maintaining a constant laser beam output energy.

18. The laser system as in any of claims 1–4, in which said selected intervals are based at least in part on combinations of changes in time, pulse count and driving voltage for maintaining a constant laser beam output energy.

19. The laser system as in any of claims 1–4, in which said selected intervals are changes in at least one of time, pulse count, driving voltage for maintaining a constant laser beam output energy, pulse shape, pulse duration, pulse energy stability, beam profile, divergence and bandwidth of said laser beam.

20. The laser system as in any of claims 1–4, in which said selected intervals are based at least in part on a combination of changes in at least two of time, pulse count, driving voltage for maintaining a constant laser beam output energy, pulse shape, pulse duration, pulse stability, beam profile and bandwidth of said laser beam.

21. The laser system as in any of claims 1–4, in which said gas supply unit includes a compartment for storing said first constituent gas prior to injecting into said discharge chamber.

22. The laser system of any of claims 1–4, in which said compartment is an accumulator whose interior volume and pressure determine the amount that partial pressure of said first constituent gas will increase in the discharge chamber after the injection.

23. The laser system of any of claims 1–4, in which said compartment is a valve assembly whose interior volume and pressure determine the amount that the partial pressure of said first constituent gas will increase in the discharge chamber after the injection.

24. The laser system as in any of claims 1–4, in which said processor and gas supply unit are configured to permit a second constituent gas to be injected into said discharge chamber along with said first constituent gas.

25. The laser system as in any of claims 1–4, in which said processor and gas supply unit are configured to permit said first constituent gas to be injected into the discharge chamber in a premix of between 0.1% and 5% of one of $F_2$ and HCl, and between 95% and 99.9% of an inert gas.

26. The laser system of claim 24, in which said processor and said gas supply unit are configured to permit said first constituent gas to be injected into the discharge chamber in a premix of between 0.1% and 5% of one of $F_2$ and HCl and between 99.9% and 95% of an inert gas, and the second constituent gas includes one or more of Kr, Xe, Ne and Ar and the total pressure increases between 0.1 and 10 mbar in the discharge chamber due to each injection of said first and second constituent gases.

27. The laser system of claim 24, in which said discharge chamber is configured to release a portion of said gas mixture within said discharge chamber when said first and second constituent gases are injected.

28. The laser system of claim 21, wherein said processor is configured to select said intervals based on a pressure measured in the compartment containing the first constituent gas.

29. The laser system of claim 21, wherein the processor is configured to select an amount of said first constituent gas to be injected based on a pressure measured in the compartment containing the first constituent gas.

30. The laser system as in any of claims 1–4, in which said processor and said gas supply unit are configured to permit said first constituent gas to be injected a group of times at said selected intervals, and the group of injections is periodically repeated.

31. The laser system as in any of claims 1 or 4, in which said first constituent gas is a halogen containing molecule and is in a premix including an inert gas and between 0.1% and 5% of said first constituent gas.

32. The laser system as in any of claims 1 or 4, in which said first constituent gas includes between 0.5% and 5% of one of $F_2$ and HCl.

33. The laser system as in any of claims 1–4, in which said gas supply unit and said processor are configured such that said injections are continuously performed at said intervals.

34. The laser system as in any of claims 1 or 4, in which said gas supply unit and said processor are configured such that multiple injections may be performed at said intervals followed by a period wherein no injections are performed.

35. A method of maintaining fluorine gas, which is subject to depletion, of a laser gas mixture also at least including a buffer gas, at a predetermined partial pressure within a discharge chamber of a gas discharge laser using a gas supply unit, comprising the steps of:
providing the laser gas mixture, at least including the fluorine gas at said predetermined partial pressure which is subject to depletion and said buffer gas, within said discharge chamber;
monitoring at least one parameter which varies with a known correspondence to the partial pressure of said fluorine gas within said discharge chamber; and
injecting fluorine gas into the discharge chamber to increase the partial pressure of the fluorine gas in the discharge chamber by between 0.0001 and 0.2 mbar at periodic intervals to return the fluorine gas substantially to said predetermined partial pressure.

36. The method of claim 35, wherein said constituent gas is injected in a premix including at least 95% buffer gas and said injecting step includes injecting said premix into the discharge chamber.

37. The method of claim 35, wherein said parameter is time.

38. The method of claim 37, wherein said intervals are between 10 seconds and five hours.

39. The method of claim 37, wherein said intervals are between 10 seconds and 30 minutes.

40. The method of claim 35, wherein said parameter is pulse count.

41. The method of claim 40, wherein said intervals are between 100,000 and ten million pulses.

42. The method of claim 40, wherein said intervals are between 100,000 and 5 million pulses.

43. The method of claim 35, wherein said parameter is driving voltage.

44. The method of claim 43, wherein said intervals are between 0.1% and 5%.

45. The method of claim 43, wherein said intervals are between 0.1% and 2%.

46. The method of claim 35, wherein said at least one parameter includes time, pulse count and driving voltage for maintaining a constant laser beam output energy.

47. The method of claim 35, wherein said at least one parameter includes pulse count and driving voltage for maintaining a constant laser beam output energy.

48. The method of claim 35, wherein said at least one parameter includes time and driving voltage for maintaining a constant laser beam output energy.

49. The method of claim 35, wherein said at least one parameter includes at least one of time, pulse count, driving voltage for maintaining a constant laser beam output energy, pulse shape, pulse duration, pulse stability, beam profile and bandwidth of said laser beam.

50. The method of claim 35, wherein said at least one parameter includes a combination of two or more of time, pulse count, driving voltage for maintaining a constant laser beam output energy, pulse shape, pulse duration, pulse stability, beam profile and bandwidth of said laser beam.

51. The method of either of claims 35 or 36, further comprising the step of filling a compartment for holding said constituent gas prior to injecting into said discharge chamber.

52. The method as in any of claims 35 or 36, wherein the injection step causes a partial pressure increase of said constituent gas in said discharge chamber between 0.0001 and 0.1 mbar.

53. The method as in any of claims 35 or 36, wherein the injection step causes a partial pressure increase of said constituent gas in said discharge chamber between 0.0001 and 0.05 mbar.

54. The method of either of claims 35 or 36, wherein said injecting step includes the step of injecting said constituent gas a group of times at said intervals, and the group of injections is periodically repeated.

55. The method of claim 35, wherein said injecting step is followed by a period wherein no injections are performed, and then by another injection step.

56. The method as in any of claims 35 or 36, wherein each successive injection returns said constituent gas substantially to the predetermined partial pressure.

57. The method of either of claims 35 or 36, wherein said constituent gas is a halogen-containing molecule.

58. The method of either of claims 35 or 36, wherein said constituent gas is one of $F_2$ and HCl.

59. The method of claim 36, wherein said constituent gas is a halogen containing molecule and said premix includes an inert gas and between 0.1% and 5% of said halogen-containing molecules.

60. A method of operating an excimer or molecular gas discharge laser having a gas discharge chamber filled with a mixture of gaseous constituents, said mixture being subject to contamination during operation of the laser, said method comprising the steps of:

injecting at least one of the gaseous constituents into the gas discharge chamber during operation of the laser, wherein the amount injected is less than 0.2 millibar; and repeating the injection step multiple times so that the laser can continue to operate while maintaining a relatively constant output.

61. A method as recited in claim 60, wherein said injection steps are selected so that the variation in energy of laser output pulses is less than 1%.

62. A method as recited in claim 60, wherein said injection steps are selected so that the beam divergence variation is less than 0.025 mrad.

63. A method as recited in claim 60, further including the step of monitoring a parameter of the laser and initiating the injection step in response to changes in the monitored parameter.

64. A method as recited in claim 63, wherein the monitored parameter is time.

65. A method as recited in claim 63, wherein the monitored parameter is pulse count.

66. A method as recited in claim 63, wherein the monitored parameter is driving voltage.

67. A method as recited in claim 63, wherein the monitored parameter is beam divergence.

68. A method as recited in claim 63, wherein the monitored parameter is bandwidth.

69. A method as recited in claim 63, wherein the monitored parameter is beam profile.

70. A method as recited in claim 60, further including the step of periodically injecting at least one of the gaseous constituents in an amount greater than 0.2 millibar, wherein the frequency of said gas injections in an amount greater than 0.2 millibar is less often than the injections which are less than 0.2 millibar.

71. A method as recited in claim 60, further including the step of periodically releasing some of the gas mixture from the gas discharge chamber.

72. A method as recited in claim 60, wherein said injection steps are selected so that a standard deviation of energy stability of laser output pulses is less than 1%.

73. The method as in any of claims 35 or 60, wherein said injection steps are selected to occur at intervals based on a pressure measured in a compartment containing the constituent gas.

74. The method as in any of claims 35 or 60, further comprising the step of selecting an amount of said first constituent gas to be injected based on a pressure measured in a compartment containing the constituent gas.

75. A method of operating an excimer or molecular gas discharge laser having a gas discharge chamber filled with a mixture of gaseous constituents at least including fluorine and a buffer gas, at least said fluorine being subject to depletion during operation of the laser, said method comprising the steps of:

injecting fluorine gas into the gas discharge chamber during operation of the laser, wherein the amount injected is less than 5% of a total amount already in said discharge chamber; and repeating the injection step multiple times so that the laser can continue to operate while maintaining a relatively constant output.

76. The method of claim 75, wherein the amount injected is less than 3% of a total amount already in said discharge chamber.

77. The method as in any of claims 60 or 75, wherein said injecting step is selected such that the pulse length of the output pulse measured as time integral square varies by less than 10%.

78. The method as in any of claims 60 or 75, wherein said injecting step is selected such that the pulse length of the output pulse measured as time integral square varies by less than 5%.

79. A gas discharge laser system, comprising:

a discharge chamber containing a laser gas mixture including at least fluorine gas, which is subject to depletion, and a buffer gas;

a pair of electrodes connected to a power supply circuit including a driving voltage for providing a pulsed discharge to energize said laser gas mixture;

a resonator surrounding said discharge chamber for generating a pulsed laser beam;

a gas supply unit connected to said discharge chamber; and a processor for controlling gaseous flow between said gas supply unit and said discharge chamber, a compartment valve-coupled between the gas supply unit and the discharge chamber for storing said fluorine prior to injecting into said discharge chamber, wherein said gas supply unit, said compartment and said processor are configured to permit a quantity of fluorine gas less than 7% of an amount of said fluorine gas in said discharge chamber to injection into said discharge chamber at selected intervals.

80. A gas discharge laser system, comprising:

a discharge chamber containing a laser gas mixture including at least fluorine gas, which is subject to depletion, and a buffer gas;

a pair of electrodes connected to a power supply circuit including a driving voltage for providing a pulsed discharge to energize said laser gas mixture;

a resonator surrounding said discharge chamber for generating a pulsed laser beam;

a gas supply unit connected to said discharge chamber; and a processor for controlling gaseous flow between said gas supply unit and said discharge chamber, a compartment valve-coupled between the gas supply unit and the discharge chamber for storing said fluorine prior to injecting into said discharge chamber, wherein said gas supply unit, said compartment and said processor are configured to permit a quantity of fluorine gas less than 5% of an amount of said fluorine gas in said discharge chamber to injection into said discharge chamber at selected intervals.

81. A gas discharge laser system, comprising:

a discharge chamber containing a laser gas mixture including at least fluorine gas, which is subject to depletion, and a buffer gas;

a pair of electrodes connected to a power supply circuit including a driving voltage for providing a pulsed discharge to energize said laser gas mixture;

a resonator surrounding said discharge chamber for generating a pulsed laser beam;

a gas supply unit connected to said discharge chamber; and a processor for controlling gaseous flow between said gas supply unit and said discharge chamber,
a compartment valve-coupled between the gas supply unit and the discharge chamber for storing said fluorine prior to injecting into said discharge chamber,
wherein said gas supply unit, said compartment and said processor are configured to permit a quantity of fluorine gas less than 3% of an amount of said fluorine gas in said discharge chamber to injection into said discharge chamber at selected intervals.

82. A gas discharge laser system, comprising:
a discharge chamber containing a laser gas mixture including at least fluorine gas, which is subject to depletion, and a buffer gas;
a pair of electrodes connected to a power supply circuit including a driving voltage for providing a pulsed discharge to energize said laser gas mixture;
a resonator surrounding said discharge chamber for generating a pulsed laser beam;
a gas supply unit connected to said discharge chamber; and
a processor for controlling gaseous flow between said gas supply unit and said discharge chamber,
a compartment valve-coupled between the gas supply unit and the discharge chamber for storing said fluorine prior to injecting into said discharge chamber,
wherein said gas supply unit, said compartment and said processor are configured to permit a quantity of fluorine gas less than 0.1 mbar to inject into said discharge chamber at selected intervals.

83. A gas discharge laser system, comprising:
a discharge chamber containing a laser gas mixture including at least fluorine gas, which is subject to depletion, and a buffer gas;
a pair of electrodes connected to a power supply circuit including a driving voltage for providing a pulsed discharge to energize said laser gas mixture;
a resonator surrounding said discharge chamber for generating a pulsed laser beam;
a gas supply unit connected to said discharge chamber; and
a processor for controlling gaseous flow between said gas supply unit and said discharge chamber,
a compartment valve-coupled between the gas supply unit and the discharge chamber for storing said fluorine prior to injecting into said discharge chamber,
wherein said gas supply unit, said compartment and said processor are configured to permit a quantity of fluorine gas less than 0.05% mbar to inject into said discharge chamber at selected intervals.

84. A gas discharge laser system, comprising:
a discharge chamber containing a laser gas mixture including at least fluorine gas, which is subject to depletion, and a buffer gas;
a pair of electrodes connected to a power supply circuit including a driving voltage for providing a pulsed discharge to energize said laser gas mixture;
a resonator surrounding said discharge chamber for generating a pulsed laser beam;
a gas supply unit connected to said discharge chamber; and
a processor for controlling gaseous flow between said gas supply unit and said discharge chamber,
a compartment valve-coupled between the gas supply unit and the discharge chamber for storing said fluorine prior to injecting into said discharge chamber,
wherein said gas supply unit, said compartment and said processor are configured to permit a quantity of fluorine gas less than 0.02% mbar to inject into said discharge chamber at selected intervals.

85. A gas discharge laser system, comprising:
a discharge chamber containing a laser gas mixture including a halogen gas which is subject to depletion;
a pair of electrodes connected to a power supply circuit including a driving voltage for providing a pulsed discharge to energize said laser gas mixture;
a resonator surrounding said discharge chamber for generating a pulsed laser beam;
a gas supply unit connected to said discharge chamber; and
a processor for controlling gaseous flow between said gas supply unit and said discharge chamber,
a compartment valve-coupled between the gas supply unit and the discharge chamber for storing said halogen gas prior to injecting into said discharge chamber,
wherein said gas supply unit, said compartment and said processor are configured to permit a quantity of 1% halogen:99% buffer premix less than 10 mbar to inject into said discharge chamber at selected intervals.

86. A gas discharge laser system, comprising:
a discharge chamber containing a laser gas mixture including a halogen gas, which is subject to depletion;
a pair of electrodes connected to a power supply circuit including a driving voltage for providing a pulsed discharge to energize said laser gas mixture;
a resonator surrounding said discharge chamber for generating a pulsed laser beam;
a gas supply unit connected to said discharge chamber; and
a processor for controlling gaseous flow between said gas supply unit and said discharge chamber,
a compartment valve-coupled between the gas supply unit and the discharge chamber for storing said halogen gas prior to injecting into said discharge chamber,
wherein said gas supply unit, said compartment and said processor are configured to permit a quantity of 1% halogen:99% buffer premix less than 5 mbar to inject into said discharge chamber at selected intervals.

87. A gas discharge laser system, comprising:
a discharge chamber containing a laser gas mixture including a halogen gas which is subject to depletion;
a pair of electrodes connected to a power supply circuit including a driving voltage for providing a pulsed discharge to energize said laser gas mixture;
a resonator surrounding said discharge chamber for generating a pulsed laser beam;
a gas supply unit connected to said discharge chamber; and
a processor for controlling gaseous flow between said gas supply unit and said discharge chamber,
a compartment valve-coupled between the gas supply unit and the discharge chamber for storing said halogen gas prior to injecting into said discharge chamber, wherein said gas supply unit, said compartment and said processor are configured to permit a quantity of 1% halogen:99% buffer premix less than 2 mbar to inject into said discharge chamber at selected intervals.

88. A gas discharge laser system, comprising:
 a discharge chamber containing a laser gas mixture including a halogen gas which is subject to depletion;
 a pair of electrodes connected to a power supply circuit including a driving voltage for providing a pulsed discharge to energize said laser gas mixture;
 a resonator surrounding said discharge chamber for generating a pulsed laser beam;
 a gas supply unit connected to said discharge chamber; and
 a processor for controlling gaseous flow between said gas supply unit and said discharge chamber,
  a compartment valve-coupled between the gas supply unit and the discharge chamber for storing said halogen gas prior to injecting into said discharge chamber,
  wherein said gas supply unit, said compartment and said processor are configured to permit a quantity of 1% halogen:99% buffer premix less than 1 mbar to inject into said discharge chamber at selected intervals.

89. A gas discharge laser system, comprising:
 a discharge chamber containing a laser gas mixture including a halogen gas which is subject to depletion;
 a pair of electrodes connected to a power supply circuit including a driving voltage for providing a pulsed discharge to energize said laser gas mixture;
 a resonator surrounding said discharge chamber for generating a pulsed laser beam;
 a gas supply unit connected to said discharge chamber; and
 a processor for controlling gaseous flow between said gas supply unit and said discharge chamber,
  a compartment valve-coupled between the gas supply unit and the discharge chamber for storing said halogen gas prior to injecting into said discharge chamber,
  wherein said gas supply unit, said compartment and said processor are configured to permit a quantity of 5% halogen:95% buffer premix less than 2 mbar to inject into said discharge chamber at selected intervals.

90. A gas discharge laser system, comprising:
 a discharge chamber containing a laser gas mixture including a halogen gas which is subject to depletion;
 a pair of electrodes connected to a power supply circuit including a driving voltage for providing a pulsed discharge to energize said laser gas mixture;
 a resonator surrounding said discharge chamber for generating a pulsed laser beam;
 a gas supply unit connected to said discharge chamber; and
 a processor for controlling gaseous flow between said gas supply unit and said discharge chamber,
  a compartment valve-coupled between the gas supply unit and the discharge chamber for storing said halogen gas prior to injecting into said discharge chamber,
  wherein said gas supply unit, said compartment and said processor are configured to permit a quantity of 5% halogen:95% buffer premix less than 1 mbar to inject into said discharge chamber at selected intervals.

91. A gas discharge laser system, comprising:
 a discharge chamber containing a laser gas mixture including a halogen gas which is subject to depletion;
 a pair of electrodes connected to a power supply circuit including a driving voltage for providing a pulsed discharge to energize said laser gas mixture;
 a resonator surrounding said discharge chamber for generating a pulsed laser beam;
 a gas supply unit connected to said discharge chamber; and
 a processor for controlling gaseous flow between said gas supply unit and said discharge chamber,
  a compartment valve-coupled between the gas supply unit and the discharge chamber for storing said halogen gas prior to injecting into said discharge chamber,
  wherein said gas supply unit, said compartment and said processor are configured to permit a quantity of 1% halogen:99% buffer premix less than 20 mbar to inject into said discharge chamber at selected intervals.

92. A gas discharge laser system, comprising:
 a discharge chamber containing a laser gas mixture including a halogen gas which is subject to depletion;
 a pair of electrodes connected to a power supply circuit including a driving voltage for providing a pulsed discharge to energize said laser gas mixture;
 a resonator surrounding said discharge chamber for generating a pulsed laser beam;
 a gas supply unit connected to said discharge chamber; and
 a processor for controlling gaseous flow between said gas supply unit and said discharge chamber,
  a compartment valve-coupled between the gas supply unit and the discharge chamber for storing said halogen gas prior to injecting into said discharge chamber,
  wherein said gas supply unit, said compartment and said processor are configured to permit a quantity of 5% halogen:95% buffer premix less than 5 mbar to inject into said discharge chamber at selected intervals.

* * * * *